US012581598B2

(12) United States Patent
Kim et al.

(10) Patent No.: US 12,581,598 B2
(45) Date of Patent: Mar. 17, 2026

(54) ELECTRONIC DEVICE COMPRISING PRINTED CIRCUIT BOARD

(71) Applicant: SAMSUNG ELECTRONICS CO., LTD., Suwon-si (KR)

(72) Inventors: Jungjoon Kim, Suwon-si (KR); Hyunseok Choi, Suwon-si (KR); Hyoseok Na, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 600 days.

(21) Appl. No.: 18/081,417

(22) Filed: Dec. 14, 2022

(65) Prior Publication Data

US 2023/0116299 A1      Apr. 13, 2023

Related U.S. Application Data

(63) Continuation of application No. PCT/KR2021/006883, filed on Jun. 2, 2021.

(30) Foreign Application Priority Data

Jun. 15, 2020      (KR) ........................ 10-2020-0072539

(51) Int. Cl.
| | |
|---|---|
| *H05K 1/14* | (2006.01) |
| *H05K 1/11* | (2006.01) |
| *H05K 1/181* | (2026.01) |

(52) U.S. Cl.
CPC ............. *H05K 1/141* (2013.01); *H05K 1/111* (2013.01); *H05K 1/181* (2013.01);
(Continued)

(58) Field of Classification Search
CPC ........ H05K 1/141; H05K 1/111; H05K 1/181; H05K 2201/10098
(Continued)

(56) References Cited

U.S. PATENT DOCUMENTS

| | | |
|---|---|---|
| 6,281,580 B1 | 8/2001 | Ise et al. |
| 7,368,821 B2 | 5/2008 | Kim et al. |

(Continued)

FOREIGN PATENT DOCUMENTS

| | | |
|---|---|---|
| JP | 5-102648 | 4/1993 |
| JP | 10-294553 | 11/1998 |

(Continued)

OTHER PUBLICATIONS

Notice of Patent Grant dated Feb. 20, 2025 for Korean Patent Application No. 10-2020-0072539 and English-language translation.

(Continued)

*Primary Examiner* — Andargie M Aychillhum

(74) *Attorney, Agent, or Firm* — Nixon & Vanderhye, P.C.

(57)      ABSTRACT

An example electronic device may include a first printed circuit board including a specified area. The first printed circuit board may include at least one first pad and at least one second pad formed in the specified area, wherein, when a first radio frequency (RF) front end module is disposed in the specified area of the first printed circuit board, at least one first pad is in contact with the first RF front end module and at least one second pad is not in contact with the first RF front end module, and, when a second RF front end module is disposed in the specified area of the first printed circuit area, at least one first pad and at least one second pad are in contact with the second RF front end module.

8 Claims, 12 Drawing Sheets

(52) U.S. Cl.
CPC .............. *H05K 2201/10098* (2013.01); *H05K 2201/10128* (2013.01); *H05K 2201/10734* (2013.01)

(58) Field of Classification Search
USPC ......................................................... 361/760
See application file for complete search history.

(56) References Cited

U.S. PATENT DOCUMENTS

| | | | |
|---|---|---|---|
| 9,198,284 | B2 | 11/2015 | Sakuma et al. |
| 2007/0187806 | A1 | 8/2007 | Kim et al. |
| 2008/0001265 | A1 | 1/2008 | Tanaka |
| 2008/0102410 | A1 | 5/2008 | Kim et al. |
| 2009/0140769 | A1 | 6/2009 | Suzuki et al. |
| 2015/0162521 | A1* | 6/2015 | Kojo ......................... H03H 9/17 310/344 |
| 2016/0302303 | A1 | 10/2016 | Kim et al. |
| 2017/0094789 | A1 | 3/2017 | Park |
| 2018/0145053 | A1* | 5/2018 | Jung ........................ H01L 24/82 |
| 2019/0073079 | A1* | 3/2019 | Xu .......................... G06F 3/0416 |
| 2020/0335942 | A1* | 10/2020 | Carson .................. H01S 5/0234 |

FOREIGN PATENT DOCUMENTS

| | | | | |
|---|---|---|---|---|
| JP | 2000-58704 | | 2/2000 | |
| JP | 2001-255352 | | 9/2001 | |
| JP | 2003-017530 | | 1/2003 | |
| JP | 4186562 | | 11/2008 | |
| JP | 2009-135204 | | 6/2009 | |
| JP | 4401253 | | 1/2010 | |
| JP | 4717554 | | 7/2011 | |
| JP | 2020-57708 | | 4/2020 | |
| KR | 2006-0014721 | | 2/2006 | |
| KR | 10-0715316 | | 4/2007 | |
| KR | 10-0782405 | | 12/2007 | |
| KR | 10-1080497 | | 10/2011 | |
| KR | 10-1097544 | | 12/2011 | |
| KR | 10-2013-0042312 | | 4/2013 | |
| KR | 10-2016-0120496 | | 10/2016 | |
| KR | 20160120496 A | * | 10/2016 | .......... H05K 1/0216 |
| KR | 10-2017-0037457 | | 4/2017 | |

OTHER PUBLICATIONS

International Search Report for PCT/KR2021/006883 dated Sep. 17, 2021, 6 pages.
Written Opinion of the ISA for PCT/KR2021/006883 dated Sep. 17, 2021, 3 pages.
Office Action dated Sep. 12, 2024 in Korean Patent Application No. 10-2020-0072539 and English-language translation.

\* cited by examiner

ELECTRONIC DEVICE COMPRISING PRINTED CIRCUIT BOARD

CROSS-REFERENCE TO RELATED APPLICATIONS

This application is a continuation of International Application No. PCT/KR2021/006883 designating the United States, filed on Jun. 2, 2021, in the Korean Intellectual Property Receiving Office and claiming priority to Korean Patent Application No. 10-2020-0072539, filed on Jun. 15, 2020, in the Korean Intellectual Property Office, the disclosures of each of which are incorporated by reference herein in their entireties.

BACKGROUND

Field

The disclosure relates to an electronic device including a printed circuit board.

Description of Related Art

Electronic devices such as smartphones have become more and more compact. The type and number of components disposed in electronic devices have been increasing to provide various functions to users, and the physical size of batteries of electronic devices have also increased to satisfy the electronic device use time requirements.

Electronic components may be disposed on the upper and lower surfaces of a printed circuit board inside an electronic device. Each electronic component may be disposed such that the lower surface thereof makes contact with the printed circuit board.

SUMMARY

A connecting member (for example, a solder bump) for connecting an electronic component to the printed circuit board of an electronic device may be formed on a surface of the electronic component to avoid an area in which other components are disposed. The printed circuit board of the electronic device may have pads formed thereon to correspond to the connecting members of electronic components, and electronic components may be disposed such that the pads are aligned with connecting members of electronic components.

Each electronic component supplier may differently design connecting members and components disposed on a surface of an electronic component. An electronic device manufacturer may be supplied with electronic components having the same function from various suppliers. Even if the function is identical, each supplier may have different position, shape, and size of components included in the electronic component, and the connecting member for connecting the electronic component to the printed circuit board may have a different position.

Therefore, the design of pads of a printed circuit board on which an electronic component is mounted may be changed according to the design of the mounted electronic component. For example, in order to verify electronic components from various suppliers, which have the same function, and to mount the same inside an electronic device, the printed circuit board of the electronic device may also be manufactured according to the design of the electronic components. As a result, costs for designing and producing printed circuit boards according to electronic components may be wasted, and if printed circuit boards cannot be changed, it may be difficult to change or differentiate electronic components as well.

An electronic device according to various example embodiments of the disclosure may include a printed circuit board on which electronic components of different designs can be disposed.

An electronic device according to various example embodiments of the disclosure may include a first printed circuit board including a designated area, wherein: the first printed circuit board includes at least one first pad and at least one second pad which are formed on the designated area; in a case in which a first radio frequency (RF) front end module is disposed on the designated area of the first printed circuit board, the at least one first pad is in contact with the first RF front end module and the at least one second pad is not in contact with the first RF front end module; and in a case in which a second RF front end module is disposed on the designated area of the first printed circuit board, the at least one first pad and the at least one second pad are in contact with the second RF front end module.

An electronic device according to various example embodiments of the disclosure may include a first printed circuit board and a radio frequency (RF) front end module disposed in a designated area of the first printed circuit board, wherein the first printed circuit board includes multiple pads arranged in the other area except a first area in the designated area, the multiple pads of the first printed circuit board include multiple first ground pads arranged in a peripheral area of the first area, the multiple first ground pads include at least one first ground pad and at least one second ground pad, the RF front end module includes a second printed circuit board including a first surface and a second surface oriented in a direction opposite to the first surface, a first electronic component disposed on the first surface, a second electronic component disposed at a position corresponding to the first area on the second surface, and multiple connection members arranged between the second surface and the first printed circuit board and configured to electrically connect the RF front end module with the multiple pads of the first printed circuit board, the multiple connection members include at least one first ground connection member disposed in a peripheral portion of the at least one second electronic component, the at least one first ground connection member comes into contact with the at least one first ground pad in a case in which the RF front end module is disposed on the first printed circuit board, and the at least one second ground pad is not in contact with the multiple connection members of the RF front end module.

An electronic device according to an example embodiment may include a printed circuit board on which electronic components having substantially the same function and having different designs can be mounted. Accordingly, electronic components having different designs may be verified without design change of the printed circuit board, thereby reducing the cost and time for development, and electronic components form various suppliers may be mounted on a single type of printed circuit board, thereby reducing manufacturing costs.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Figure 1:
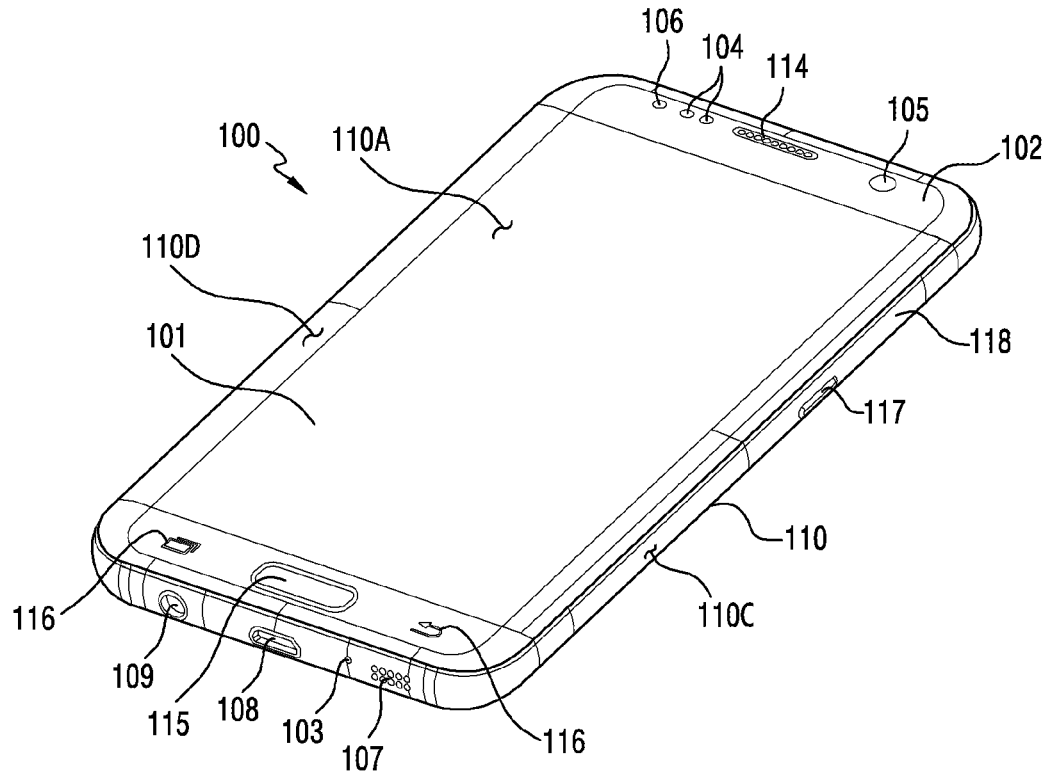
FIG. 1 is a front perspective view of an example electronic device according to various embodiments.

FIG. 1 is a front perspective view of an example electronic device according to various embodiments.

Figure 2:
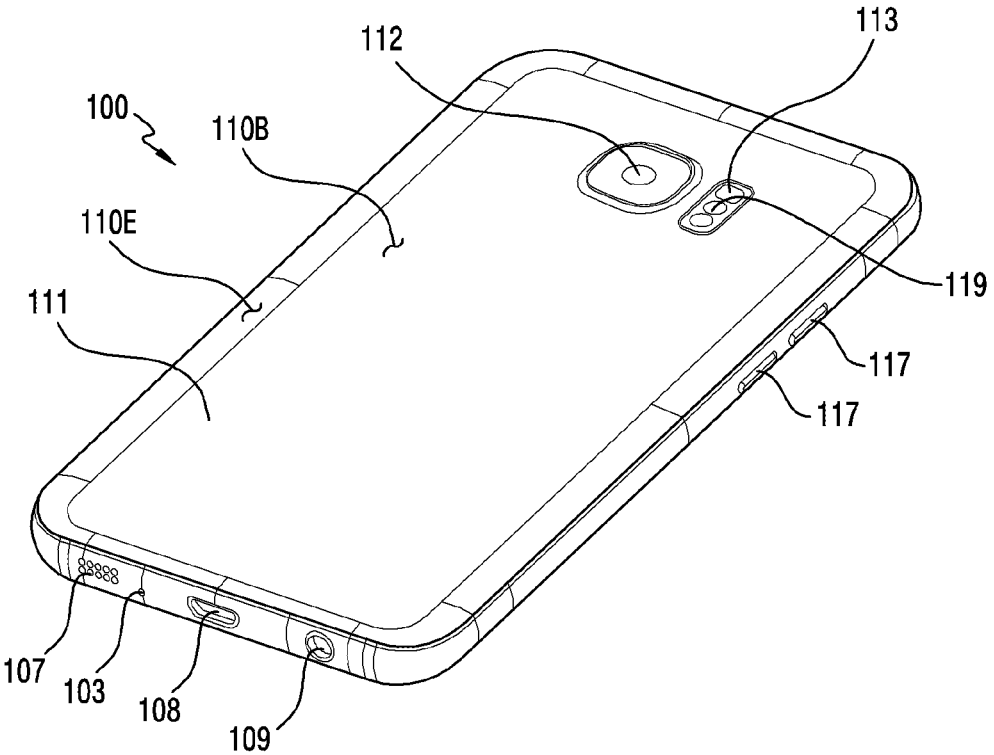
FIG. 2 is a rear perspective view of the example electronic device of FIG. 1.

FIG. 2 is a rear perspective view of the example electronic device of FIG. 1.

Referring to FIGS. 1 and 2, an electronic device 100 according to an example embodiment may include a first surface (or a front surface) 110A, a second surface (or a rear surface) 110B, and a housing 110 including a side surface 110C surrounding the space between the first surface 110A and the second surface 110B. In an embodiment (not shown), a housing may be referred to, for example, as a structure which forms a part of the first surface 110A, the second surface 110B, and the side surface 110C of FIG. 1. According to an embodiment, the first surface 110A may be formed by a front plate 102 (e.g., a glass plate including various coating layers, or a polymer plate) of which at least a portion is substantially transparent. The second surface 110B may be formed by a substantially opaque rear plate 111. For example, the rear plate 111 may be formed by coated or colored glass, ceramic, polymer, metal (e.g., aluminum, stainless steel (STS), or magnesium), or a combination of at least two of the above materials. The side surface 110C may be coupled to the front plate 102 and the rear plate 111, and may be formed by a side bezel structure (or "a side member") 118 including metal and/or polymer. In various embodiments, the rear plate 111 and the side bezel structure 118 may be integrally formed, and may include the same material (e.g., a metal material such as aluminum).

In the illustrated example embodiment, the front plate 102 may include two first areas 110D which are provided at opposite ends of the long edge of the front plate 102 and bent from the first surface 110A toward the rear plate 111 to extend seamlessly. In the illustrated embodiment (see FIG. 2), the rear plate 111 may include two second areas 110E which are provided at opposite ends of the long edge thereof and bent from the second surface 110B toward the front plate 102 to extend seamlessly. In various embodiments, the front plate 102 (or the rear plate 111) may include only one of the first areas 110D (or the second areas 110E). In an embodiment, a part of the first areas 110D or the second areas 110E may not be included therein. In an embodiment, in a case of being viewed from the side surface of the electronic device 100, the side bezel structure 118 may have a first thickness (or width) in the side of the side surface not including the first areas 110D or the second areas 110E, and may have a second thickness thinner than the first thickness in the side of the side surface including the first regions 110D or the second regions 110E.

According to an embodiment, the electronic device 100 may include at least one of a display 101, audio modules 103, 107, and 114, sensor modules 104, 116, and 119, camera modules 105, 112, and 113, a key input device(s) 117, a light-emitting element 106, and connector holes 108 and 109. In various embodiments, at least one (e.g., the key input device 117 or the light-emitting element 106) of the above elements may be omitted from the electronic device 100, or other elements may be additionally included therein.

For example, the display 101 may be exposed through a substantial portion of the front plate 102. In various embodiments, at least a part of the display 101 may be exposed through the front plate 102 forming the first surface 110A and the first areas 110D of the side surface 110C. In various embodiments, the corners of the display 101 may be formed to have a shape substantially the same as the outer shape of the front plate 102 adjacent thereto. In an embodiment (not shown), in order to expand an area which allows the display 101 to be exposed, the gap between the outer perimeter of the display 101 and the outer perimeter of the front plate 102 may be formed to be substantially the same.

In an embodiment (not shown), a recess or an opening may be formed in a part of a screen display area of the display 101, and at least one of the audio module 114, the sensor module 104, the camera module 105, and the light-emitting element 106, which are aligned with the recess or the opening, may be included therein. In an embodiment (not shown), at least one of the audio module 114, the sensor module 104, the camera module 105, the fingerprint sensor 116, and the light-emitting element 106 may be included on the rear surface of the screen display area of the display 101. In an embodiment (not shown), the display 101 may be coupled to or disposed adjacent to a touch detection circuit, a pressure sensor capable of measuring the intensity (pressure) of touch, and/or a digitizer for detecting a magnetic field-type stylus pen. In some embodiments, at least a part of the sensor modules 104 or 119 and/or at least a part of a key input device 117 may be arranged in the first areas 110D and/or the second areas 110E.

The audio modules 103, 107, and 114 may include a microphone hole 103 and speaker holes 107 and 114. A microphone for obtaining external sound may be disposed inside the microphone hole 103, and in various embodiments, multiple microphones may be arranged to detect the direction of sound. The speaker holes 107 and 114 may include an external speaker hole 107 and a receiver hole 114 for phone calls. In various embodiments, the speaker holes 107 and 114 and the microphone hole 103 may be implemented as one hole, or a speaker (e.g., a piezo speaker) may be included therein without the speaker holes 107 and 114.

The sensor modules 104, 116, and 119 may generate an electrical signal or a data value corresponding to an internal operation state of the electronic device 100 or an external environmental state. For example, the sensor modules 104, 116, and 119 may include first sensor modules 104 (e.g., a proximity sensor) and/or a second sensor module 116 (e.g., a fingerprint sensor) disposed on the first surface 110A of the housing 110, and/or a third sensor module 119 (e.g., a heart rate monitor (HRM) sensor) and/or a fourth sensor module 116 (e.g., a fingerprint sensor) disposed on the second surface 110B of the housing 110. The fingerprint sensor may be disposed on not only the first surface 110A (e.g., the display 101) but also the second surface 110B of the housing 110. The electronic device 100 may further include other sensor modules (not illustrated) including, for example, at least one of a gesture sensor, a gyro sensor, a barometric pressure sensor, a magnetic sensor, an acceleration sensor, a grip sensor, a color sensor, an infrared (IR) sensor, a biometric sensor, a temperature sensor, a humidity sensor, or an illuminance sensor 104.

The camera modules 105, 112, and 113 may include a first camera module 105 disposed on the first surface 110A of the electronic device 100, and a second camera module 112 and/or a flash 113 disposed on the second surface 110B. The camera modules 105 and 112 each may include one lens or multiple lenses, an image sensor, and/or an image signal processor. For example, the flash 113 may include a light-emitting diode or a xenon lamp. In various embodiments, two or more lenses (an infrared camera, a wide-angle lens, and a telephoto lens) and image sensors may be arranged on one surface of the electronic device 100.

The key input device(s) 117 may be disposed on the side surface 110C of the housing 110. In an embodiment, the electronic device 100 may not include a part or all of key input device(s) 117 mentioned above, and the key input device 117 not included therein may be implemented as a different input type such as a soft key, on the display 101. In various embodiments, the key input device may include the sensor module 116 disposed on the second surface 110B of the housing 110.

For example, the light-emitting element 106 may be disposed on the first surface 110A of the housing 110. For example, the light-emitting 106 may be configured to provide state information of the electronic device 100 in the form of light. In an embodiment, for example, the light-emitting element 106 may provide a light source operating in association with an operation of the camera module 105. For example, the light-emitting element 106 may include an LED, an IR LED, and a xenon lamp.

The connector holes 108 and 109 may include a first connector hole 108 capable of accommodating a connector (for example, a USB connector) for transmitting or receiving electric power and/or data to or from an external electronic device, and/or a second connector hole 109 (for example, an earphone jack) capable of accommodating a connector for transmitting or receiving an audio signal to or from an external electronic device.

Figure 3:
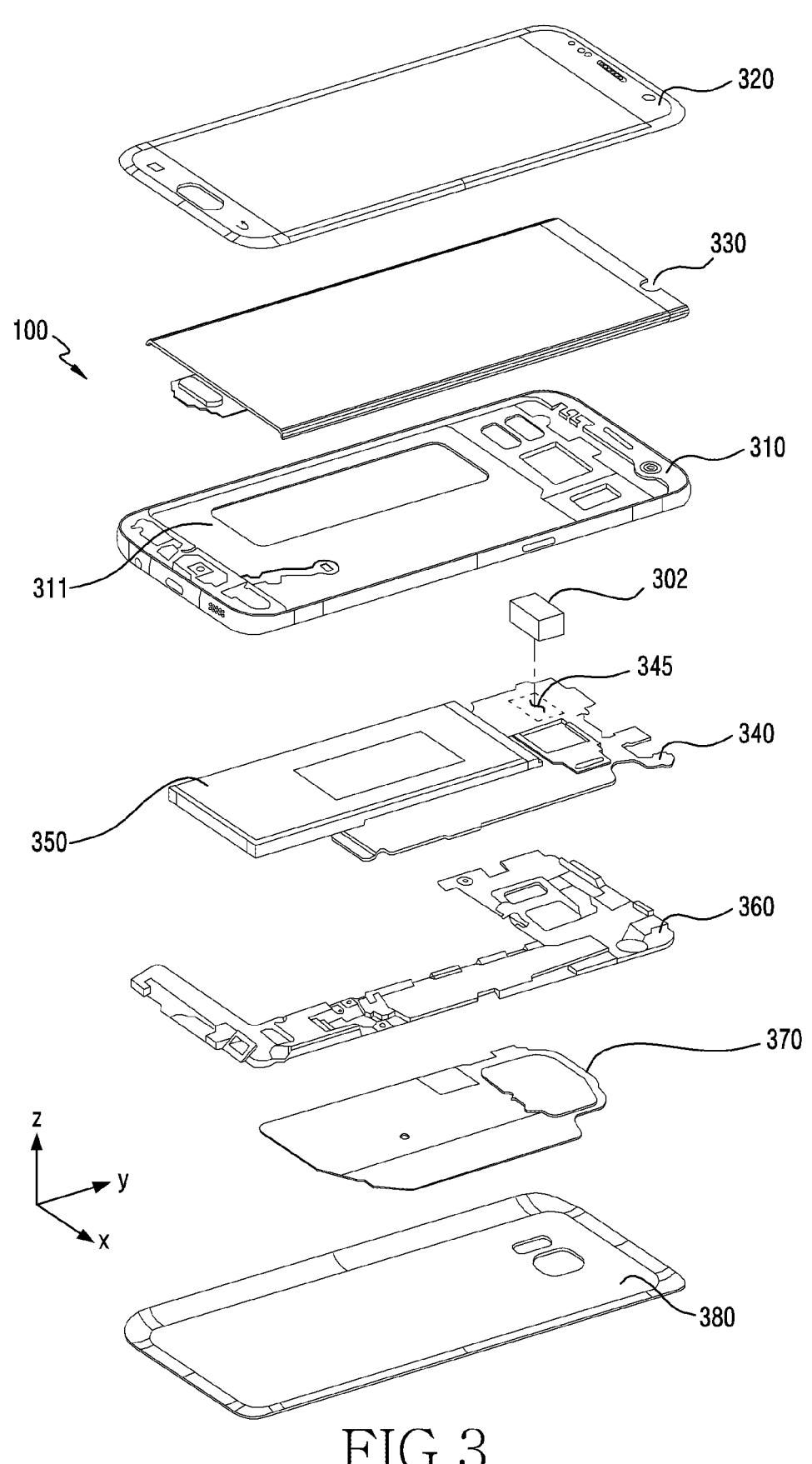
FIG. 3 is an exploded perspective view of the example electronic device of FIG. 1.

FIG. 3 is an exploded perspective view of the example electronic device of FIG. 1.

Referring to FIG. 3, the electronic device 100 may include a side bezel structure 310 (e.g., the side bezel structure 118 in FIG. 1), a first support member 311 (e.g., a bracket), a front plate 320 (e.g., the front plate 102 in FIG. 1), a display 330 (e.g., the display 101 in FIG. 1), a first printed circuit board 340, a battery 350, a second support member 360 (e.g., a rear case), an antenna 370, and a rear plate 380 (e.g., the rear plate 111 in FIG. 1). In various embodiments, at least one (e.g., the first support member 311 or the second support member 360) of elements may be omitted from the electronic device 100, or other elements may be additionally included therein. At least one of elements of the electronic device 100 may be the same as or similar to at least one of elements of the electronic device 100 in FIG. 1 or FIG. 2, and overlapping descriptions will not be repeated hereinafter. At least one of the first side bezel structure 310, the first support member 311, the second support member 360, and/or the rear plate 380 in FIG. 3 may be understood to be part of the housing 110 in FIG. 1.

The first support member 311 may be disposed inside the electronic device 100 to be connected to the side bezel structure 310 or to be integrally formed with the side bezel structure 310. For example, the first support member 311 may be formed of a metal material and/or a non-metal (e.g., polymer) material. The first support member 311 may have one surface to which the display 330 is coupled, and another surface to which the first printed circuit board 340 is coupled.

The first printed circuit board 340 may have, for example, a processor, a memory, and/or an interface, which are mounted thereon. For example, the processor may include one or more of a central processing device, an application processor, a graphic processing device, an image signal processor, a sensor hub processor, and a communication processor.

For example, the memory may include a volatile memory or a non-volatile memory.

For example, the interface may include a high-definition multimedia interface (HDMI), a universal serial bus (USB) interface, an SD card interface, and/or an audio interface. For example, the interface may be configured to electrically or physically connect the electronic device 100 to an external electronic device, and may include a USB connector, an SD card/MMC connector, or an audio connector.

In an embodiment, the first printed circuit board 340 may include a designated area 345. An electronic component 302 (or module) having a designated function may be disposed on the designated area 345. The position and/or the shape of the designated area 345 is not limited by the illustrated example.

The battery 350 may be a device for supplying electric power to at least one element of the electronic device 100, and for example, may include a non-rechargeable primary cell, a rechargeable secondary cell, or a fuel cell. For example, at least a part of the battery 350 may be disposed on substantially the same plane as the first printed circuit board 340. The battery 350 may be integrally disposed inside the electronic device 100, or may be disposed to be detachable/attachable from/to the electronic device 100.

The antenna 370 may be disposed between the rear plate 380 and the battery 350. For example, the antenna 370 may include a near field communication (NFC) antenna, a wireless charging antenna, and/or a magnetic secure transmission (MST) antenna. For example, the antenna 370 may perform a short-range communication with an external device, or may wirelessly transmit or receive electric power required for charging. In an embodiment, an antenna structure may be formed by a part of the side bezel structure 310 and/or the first support member 311, or a combination thereof.

Figure 4:
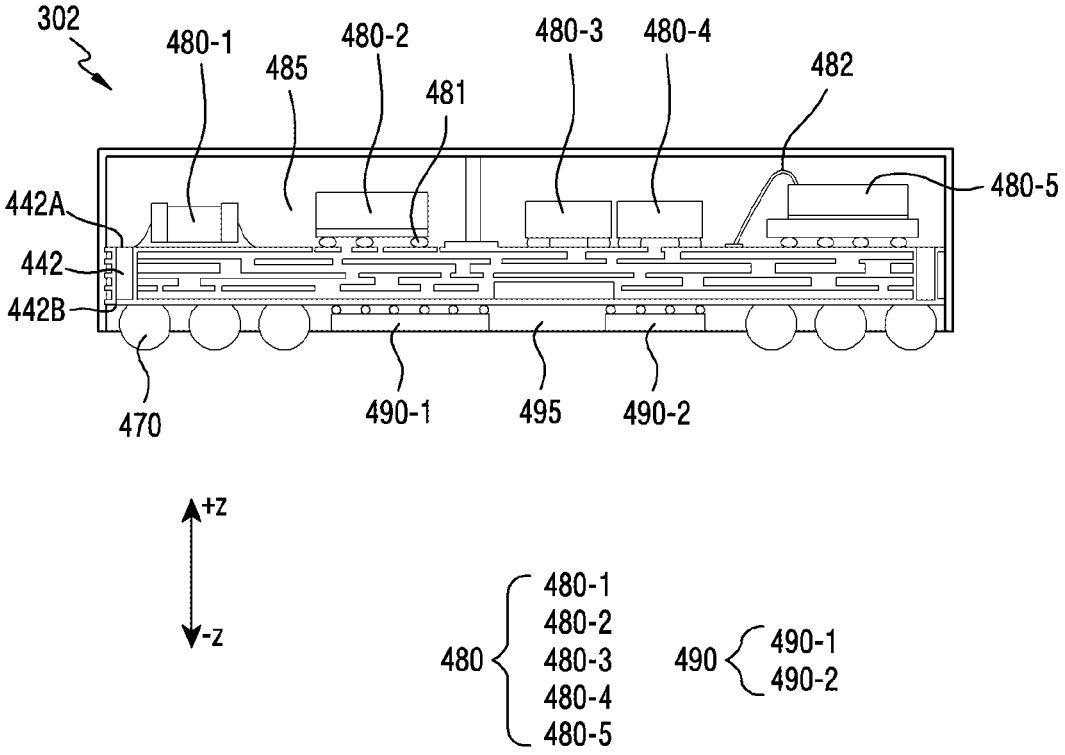
FIG. 4 illustrates a cross-sectional view of an example electronic component according to various embodiments.

FIG. 4 illustrates a cross-sectional view of the example electronic component 302 according to an embodiment.

Referring to FIG. 4, the electronic component 302 according to an embodiment may include at least one of a second printed circuit board 442, at least one first electronic element 480, at least one second electronic element 490, and/or a connection member 470.

In an embodiment, the second printed circuit board 442 may include a first surface 442A and a second surface 442B oriented in a direction opposite to the first surface 442A. Various configurations or components for a function of the electronic component 302 may be arranged on the first surface 442A and the second surface 442B of the second printed circuit board 442. For example, the at least one first electronic element 480 may be disposed on the first surface 442A of the second printed circuit board 442, and the at least one second electronic element 490 may be disposed on the second surface 442B. In an embodiment, the electronic component 302 may be disposed such that the second surface 442B of the second printed circuit board 442 faces one surface of a printed circuit board (e.g., the first printed circuit board 340 of the electronic device 100 in FIG. 3) of an electronic device.

In an embodiment, the second printed circuit board 442 may include multiple layers. For example, the multiple layers may include conductive layers and non-conductive layers alternately stacked with the conductive layers. At least a part of various configurations (e.g., at least one first and second electronic element 480 and 490) included in the electronic component 302 may be operatively coupled to each other through an electrical path provided by the second printed circuit board 442.

In an embodiment, the at least one first electronic element 480 may include at least one of a first element 480-1, a second element 480-2, a third element 480-3, a fourth element 480-4, and/or a fifth element 480-5. For example, the at least one first electronic element 480 may be disposed on the first surface 442A of the second printed circuit board 442.

In an embodiment, the at least one second electronic element 490 may include a sixth element 490-1 and/or a seventh element 490-2. For example, the at least one second electronic element 490 may be disposed on the second surface 442B of the second printed circuit board 442.

In an embodiment, the at least one first electronic element 480 and/or second electronic element 490 may be disposed on the first surface 442A and/or the second surface 442B of the second printed circuit board 442 using surface-mount technology (SMT).

In an embodiment, various methods may be used in order to mount the at least one first electronic element 480 and/or second electronic element 490 on the second printed circuit board 442. For example, a solder ball shown by reference numeral 481 may be used, or a bonding wire shown by reference numeral 482 may be used. However, the method for mounting the at least one first electronic element 480 and/or second electronic element 490 on the second printed circuit board 442 is not limited by the illustrated examples, and various methods may be used therefor.

In an embodiment, in order to protect the at least one first electronic element 480 and/or second electronic element 490, a first protective layer 485 may be formed on the first surface 442A of the second printed circuit board 442, and a second protective layer 495 may be formed on the second surface 442B. The first protective layer 485 may cover the at least one first electronic element 480 to prevent the at least one first electronic element 480 from being exposed to an external environment. The second protective layer 495 may cover the at least one second electronic element 490 to prevent the at least one second electronic element 490 from being exposed to an external environment. For example, the first protective layer 485 and the second protective layer 495 may include an epoxy molding compound (EMC), but is not limited thereto.

In an embodiment, the electronic component 302 may have a designated function, and the at least one first electronic element 480 and/or the at least one second electronic element 490 of the electronic component 302 may be designed in order to implement the designated function. For example, the electronic component 302 may be a radio frequency (RF) front end module such as an LNA-power amplifier module integrated duplexer (L-PAMiD). In this case, the electronic component 302 may include a duplexer for branching a transmission and/or a reception signal path, a low noise amplifier (LNA) of a receiving end, a power amplifier (PA) of the transmitting end, function blocks such as a filter and/or a switch for the selection of a frequency band, and control blocks to control the same. The function blocks and/or the control blocks described above may be included in the at least one first electronic element 480 and second electronic element 490 arranged on both surfaces of the second printed circuit board 442 of the electronic component 302. The number, the size, or the arrangement position of the at least one first electronic element 480 and/or second electronic element 490 disposed on the second printed circuit board 442 may be variously changed in a design. For example, the sixth element 490-1 may include a control integrated circuit formed as a single chip or multiple chips for controlling other elements of the electronic component 302. For another example, the sixth element 490-1 may include a component (or components) for an LNA function block and/or a filter function block. Embodiments of the disclosure are not limited to components such as an L-PAMiD described above, and may be applied to components having various functions, which are manufactured by electronic elements being arranged on the first surface 442A and/or the second surface 442B of the second printed circuit board 442. For example, the electronic component 302 may include at least one of the configurations in FIG. 11. For example, the electronic component 302 may include at least one of a processor 1120, a communication module 1190, and/or a memory 1130 in FIG. 11.

In an embodiment, the connection member 470 may be disposed on the second surface 442B of the second printed circuit board 442. The electronic component 302 may be disposed in a form in which the second surface 442B faces one surface of a printed circuit board (e.g., the first printed circuit board 340 of the electronic device 100 in FIG. 3) of an electronic device. The electronic component 302 may be electrically connected to a printed circuit board of an electronic device by the connection member 470. For example, a solder paste may be applied to pads provided on a printed circuit board of an electronic device, the electronic component 302 may be disposed on the printed circuit board of the electronic device such that the connection member 470 is in contact with the pads, and then heat may be applied thereto. Therefore, the electronic component 302 may be electrically and mechanically coupled to the printed circuit board of the electronic device. For example, the connection member 470 may include a solder ball, but is not limited thereto. In addition, in order to electrically and mechanically couple the electronic component 302 to the printed circuit board of the electronic device, the connection member may include various configurations.

Figure 5:
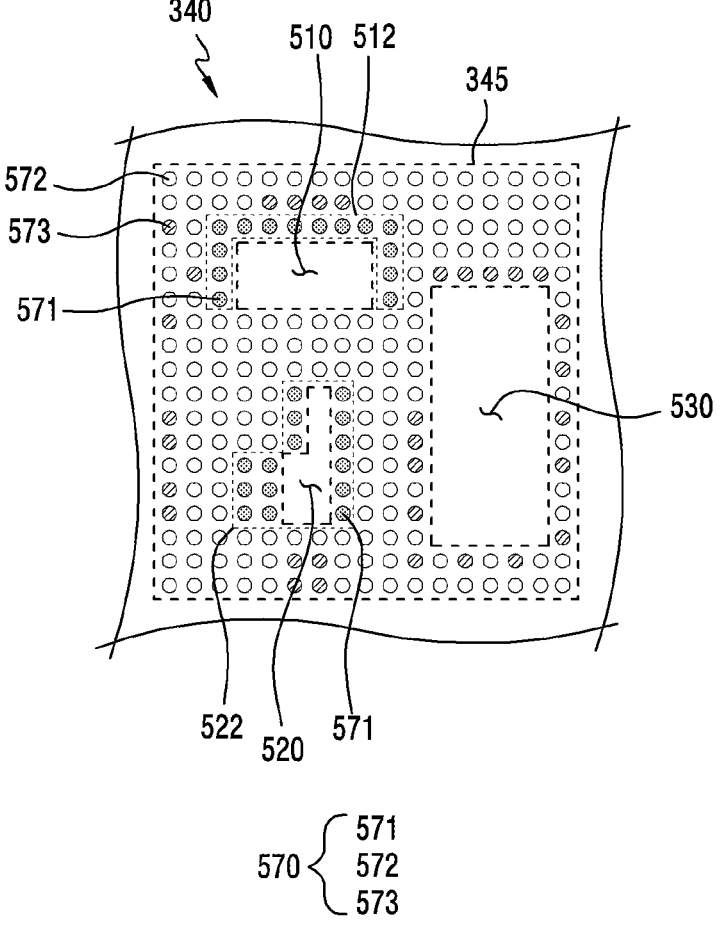
FIG. 5 illustrates a designated area of an example first printed circuit board according to various embodiments.

FIG. 5 illustrates the designated area 345 of the example first printed circuit board 340 according to various embodiments.

Referring to FIG. 5, the designated area 345 of the first printed circuit board 340 according to an embodiment may include at least one of a first area 510, a second area 520, and/or a third area 530.

In an embodiment, the first printed circuit board 340 may include pads 570 formed on an area except for at least one of the first area 510, the second area 520, and/or the third area 530 of the designated area 345. For example, the pads 570 may be arranged on the designated area 345 of the first printed circuit board 340, but may not be arranged in at least one of the first area 510, the second area 520, and the third area 530. At least one of the pads 570 may be coupled to a connection member (e.g., the connection member 470 of the electronic component 302 in FIG. 4) of an electronic component. In an embodiment, the pads 570 may include at least one of a first pad 571, a second pad 572, and/or a third pad 573. In an embodiment, the first pad 571 may be disposed on a peripheral part 512 of the first area 510 and/or a peripheral part 522 of the second area 520. Although multiple first pads 571 are illustrated in FIG. 5, at least one pad may be included therein. Although multiple second pads 572 are illustrated in FIG. 5, at least one pad may be included therein. Although multiple third pads 573 are illustrated in FIG. 5, at least one pad may be included therein.

Figure 6:
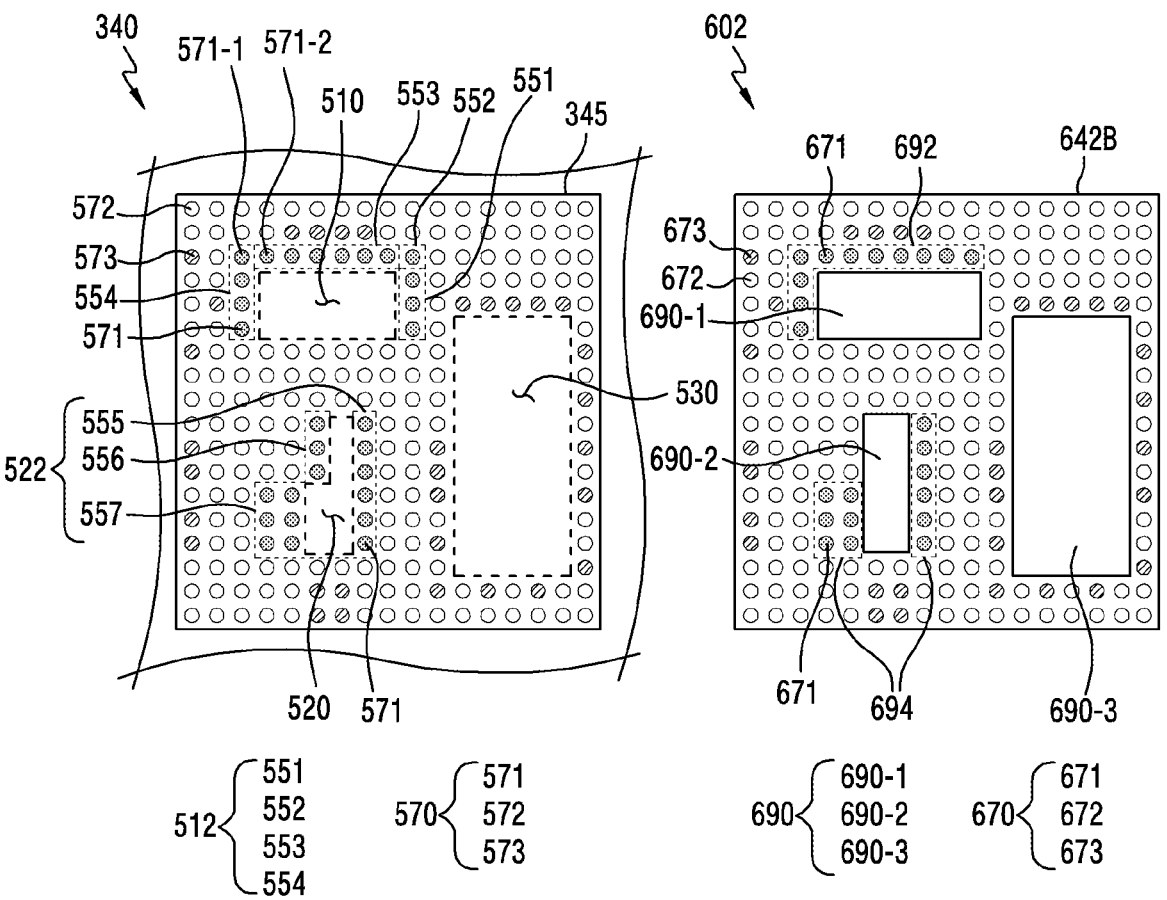
FIG. 6 illustrates a designated area of an example first printed circuit board and a second surface of an example first electronic component according to various embodiments.

FIG. 6 illustrates a designated area 345 of an example first printed circuit board 340 and an example second surface 642B of an example first electronic component 602 according to various embodiments. FIG. 6 illustrates the second surface 642B of the first electronic component 602 projected in a direction (e.g., the—z-direction in FIG. 4) in case that the first electronic component 602 is seen from above (e.g., a top-down view) for easy description of the disclosure.

Referring to FIG. 6, the first electronic component 602 (e.g., the electronic component 302 in FIG. 4) may include at least one electronic element 690 (e.g., the at least one second electronic element 490 in FIG. 4) disposed on the second surface 642B (e.g., the second surface 442B in FIG. 4). For example, the at least one electronic element 690 may include at least one of a first element 690-1, a second element 690-2, and/or a third element 690-3 (e.g., the sixth element 490-1 in FIG. 4).

In an embodiment, the first area 510 of the first printed circuit board 340 may correspond to the first element 690-1. For example, in a state in which the first electronic component 602 is disposed on the first printed circuit board 340, in a case of being viewed from above the first printed circuit board 340 (e.g., a top-down view), the first area 510 may overlap at least a part of the first element 690-1. In an embodiment, at least a part of the first element 690-1 may overlap the first area 510 and the peripheral part 512 of the first printed circuit board 340. For example, the first element 690-1 may overlap the first area 510 of the first printed circuit board 340 and the second peripheral part 552 of the first area 510.

In an embodiment, the peripheral part 512 of the first area 510 may include at least one of a first peripheral part 551, a second peripheral part 552, a third peripheral part 553, and/or a fourth peripheral part 554.

In an embodiment, the second area 520 of the first printed circuit board 340 may correspond to the second element 690-2 of the first electronic component 602. For example, in a state in which the first electronic component 602 is disposed on the first printed circuit board 340, in a case of being viewed from above the first printed circuit board 340, the second area 520 may overlap the second element 690-2. In an embodiment, the second element 690-2 may overlap the second area 520 and the peripheral part 522. For example, the second element 690-2 may overlap the second area 520 and a fifth peripheral part 555 of the second area 520.

In an embodiment, the peripheral part 522 of the second area 520 may include at least one of the fifth peripheral part 555, a sixth peripheral part 556, and/or a seventh peripheral part 557.

In an embodiment, the third area 530 of the first printed circuit board 340 may correspond to the third element 690-3 of the first electronic component 602. For example, in a state in which the first electronic component 602 is disposed on the first printed circuit board 340, in a case of being viewed from above the first printed circuit board 340, the third area 530 may overlap the third element 690-3. For example, the third element 690-3 may have an area which is substantially the same as the area of the third area 530 or smaller than the area of the third area 530.

In an embodiment, the first electronic component 602 may include a connection member 670 (e.g., the connection member 470 in FIG. 4) disposed around the at least one electronic element 690. For example, the connection member 670 may be formed on the second surface 642B (e.g., the second surface 442B in FIG. 4) of the first electronic component 602.

In an embodiment, the connection member 670 may include at least one of a first member 671, a second member 672, and/or a third member 673. In an embodiment, the first member 671 may be disposed on a peripheral part 692 of the first element 690-1 and/or a peripheral part 694 of the second element 690-2. In an embodiment, the first member 671 may be designed as a port electrically connected to a ground. In an embodiment, the second member 672 or the third member 673 may be designed as a port for one of signals requiring electrical connection with the first printed circuit board 340 such as a power source, a control signal, a RF signal, or a ground.

In an embodiment, in a state in which the first electronic component 602 is disposed on the first printed circuit board 340, the connection member 670 may be in contact with at least a part of the pads 570 formed on the first printed circuit board 340. The first electronic component 602 may be mechanically and electrically connected to the first printed circuit board 340 through the connection member 670.

In an embodiment, the first member 671 may correspond to at least a part of the first pad 571. For example, the first member 671, which is disposed on the peripheral part 692 of the first element 690-1, may be in contact with at least a part of the first pad 571 disposed on the peripheral part 512 of the first area 510. For example, in a state in which the first electronic component 602 is disposed on the first printed circuit board 340, the first member 671, which is disposed on the peripheral part 692 of the first element 690-1, may be in contact with the first pad 571 disposed on the second peripheral part 552, the first pad 571 disposed on the third peripheral part 553, and the first pad 571 disposed on the fourth peripheral part 554 of the peripheral part 512 of the first area 510. The first pad 571 disposed on the first peripheral part 551 of the peripheral part 512 of the first area 510 may not be in contact with the connection member 670 of the first electronic component 602.

In an embodiment, the first member 671, which is disposed on the peripheral part 694 of the second element 690-2, may be in contact with at least a part of the first pad 571 disposed on the peripheral part 522 of the second area 520. For example, in a state in which the first electronic component 602 is disposed on the first printed circuit board 340, the first member 671, which is disposed on the peripheral part 694 of the second element 690-2, may be in contact with the first pad 571 disposed on the fifth peripheral part 555 and the seventh peripheral part 557 of the peripheral part 522 of the second area 520. The first pad 571 disposed on the sixth peripheral part 556 of the peripheral part 522 of the second area 520 may not be in contact with the connection member 670 of the first electronic component 602.

In an embodiment, the first member 671 and the first pad 571, which are electrically connected to each other, may perform a first function. For example, the first electronic component 602 (or various integrated circuits included in the first electronic component 602) may be grounded through the first member 671 and the first pad 571. However, the first function is not limited by the above-described example.

In an embodiment, the second member 672 of the first electronic component 602 may correspond to the second pad 572 of the first printed circuit board 340. For example, in a state in which the first electronic component 602 is disposed on the first printed circuit board 340, in a case of being viewed from above the first printed circuit board 340, the second member 672 may overlap the second pad 572. The second member 672 may overlap the second pad 572. In an embodiment, even though the second member 672 is not in contact with the second pad 572, the second member 672 may be electrically connected through other conductive materials (e.g., lead).

According to an embodiment, that the pads provided on the first printed circuit board 340 and members of the electronic component, which correspond to the pads, are in contact with each other, may include not only physical contact therebetween, but also electrical connection through other conductive materials even though same are not in physical contact with each other.

In an embodiment, the second member 672 of the first electronic component 602 may be electrically connected to the second pad 572 of the first printed circuit board 340 to perform a second function. For example, the second function may be the same as the first function.

In an embodiment, the third member 673 of the first electronic component 602 may correspond to the third pad 573 of the first printed circuit board 340. For example, in a state in which the first electronic component 602 is disposed on the first printed circuit board 340, in a case of being viewed from above the first printed circuit board 340, the third member 673 may overlap the third pad 573. The third member 673 may be in contact with the third pad 573. In an embodiment, the third member 673 may be electrically connected to the third pad 573 to perform a third function. For example, a signal (e.g., a data signal or an electric power signal), which is input or output from the first electronic component 602, may be delivered through the third member 673 and the third pad 573. However, the third function is not limited by the above-described example.

Figure 7:
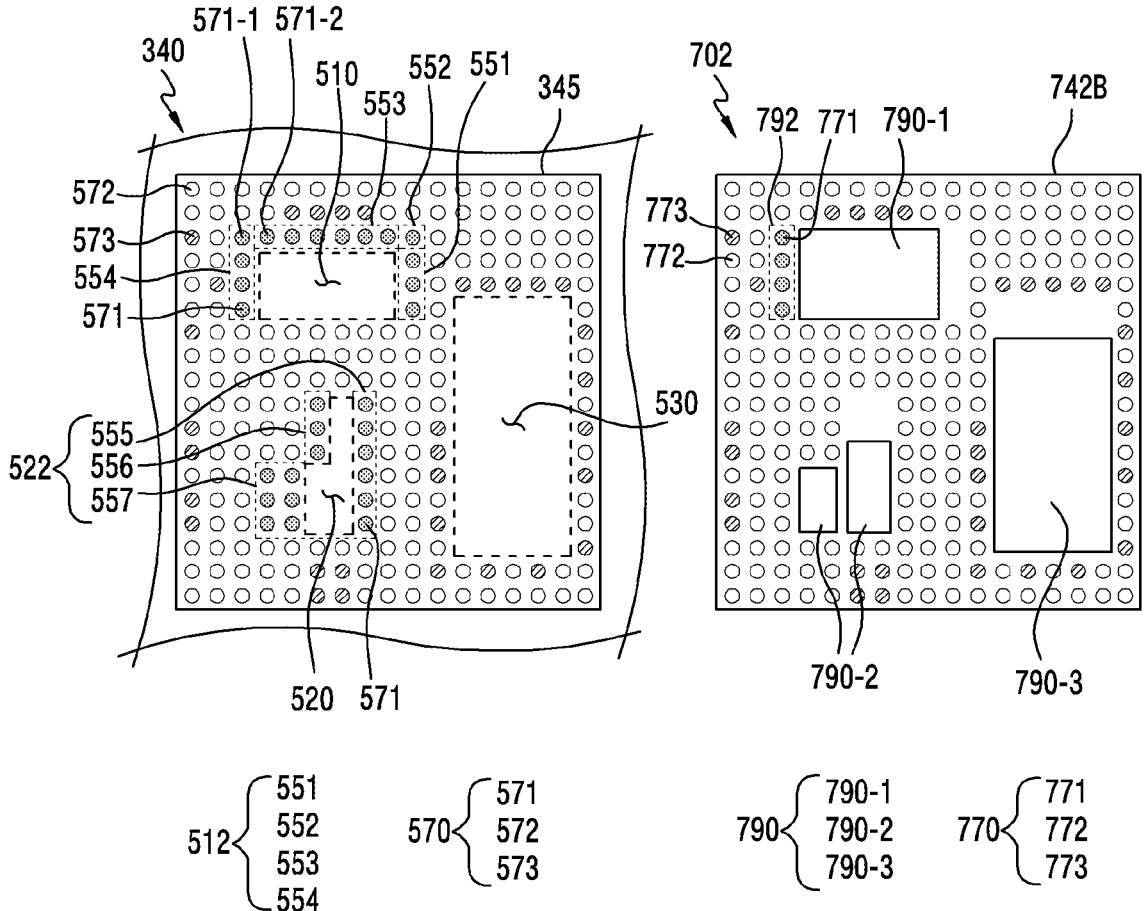
FIG. 7 illustrates a designated area of an example first printed circuit board and a second surface of an example second electronic component according to various embodiments.

FIG. 7 illustrates the designated area 345 of the first printed circuit board 340 and the second surface 742B of a second electronic component 702 according to various embodiments. FIG. 7 illustrates the second surface 742B of the second electronic component 702 projected in a direction (e.g., the—z-direction in FIG. 4) in a case in which the second electronic component 702 is viewed from above for easy description of the disclosure.

Referring to FIG. 7, the second electronic component 702 (e.g., the electronic component 302 in FIG. 4) may include at least one electronic element 790 (e.g., the at least one electronic element 490 in FIG. 4) disposed on the second surface 742B (e.g., the second surface 442B in FIG. 4). The at least one electronic element 790 may include at least one of a first element 790-1, a second element 790-2, and/or a third element 790-3 (e.g., the sixth element 490-1 in FIG. 4). Differently from the second element 690-2 in FIG. 6, the second element 790-2 in FIG. 7 may be implemented by multiple elements. The second electronic component 702 may perform substantially the same function as the first electronic component 602 in FIG. 6, but may have a design different therefrom.

In an embodiment, the first printed circuit board 340 may be substantially the same as the first printed circuit board 340 in FIG. 6.

In an embodiment, the first area 510 of the first printed circuit board 340 may correspond to the first element 790-1. For example, in a state in which the second electronic component 702 is disposed on the first printed circuit board 340, in a case of being viewed from above the first printed circuit board 340, at least a part of the first area 510 may overlap the first element 790-1. In an embodiment, at least a part of the first element 790-1 may overlap the first area 510 and the peripheral part 512 of the first printed circuit board 340. For example, the first element 790-1 may overlap the first area 510 and the third peripheral part 553 of the peripheral part 512 of the first area 510. For example, the peripheral part 512 of the first area 510 may include at least one of the first peripheral part 551, the second peripheral part 552, the third peripheral part 553, and/or the fourth peripheral part 554.

In an embodiment, the second area 520 of the first printed circuit board 340 may correspond to the second element 790-2 of the second electronic component 702. For example, in a state in which the second electronic component 702 is disposed on the first printed circuit board 340, in a case of being viewed from above the first printed circuit board 340, at least a part of the second area 520 may overlap the second element 790-2. For example, the second element 790-2 may overlap at least a part of the second area 520 and at least a part of the peripheral part 522 of the second area 520. For example, the peripheral part 522 of the second area 520 may include at least one of the fifth peripheral part 555, the sixth peripheral part 556, and/or the seventh peripheral part 557.

In an embodiment, the third area 530 of the first printed circuit board 340 may correspond to the third element 790-3 of the second electronic component 702. For example, in a state in which the second electronic component 702 is disposed on the first printed circuit board 340, in a case of being viewed from above the first printed circuit board 340, at least a part of the third area 530 may overlap the third element 790-3. For example, the third element 790-3 may have an area which is substantially the same as the area of the third area 530 or smaller than the area of the third area 530.

In an embodiment, the second electronic component 702 may include a connection member 770 (e.g., the connection member 470 in FIG. 4) disposed around the at least one electronic element 790. For example, the connection member 770 may be formed on the second surface 742B (e.g., the second surface 442B in FIG. 4) of the second electronic component 702.

In an embodiment, the connection member 770 may include at least one of a first member 771, a second member 772, and/or a third member 773. In an embodiment, the first member 771 may be disposed on a peripheral part 792 of the first element 790-1. In an embodiment, differently from the first electronic component 602 in FIG. 6, the second electronic component 702 in FIG. 7 may not include the first member 771 disposed around the second element 790-2. In an embodiment, the first member 771 may be designed as a port electrically connected to a ground. In an embodiment, the second member 772 or the third member 773 may be designed as a port for one of signals requiring electrical connection with the first printed circuit board 340, such as a power source, a control signal, a RF signal, or a ground.

In an embodiment, in a state in which the second electronic component 702 is disposed on the first printed circuit board 340, the connection member 770 may be in contact with at least a part of the pads 570 formed on the first printed circuit board 340. The second electronic component 702 may be mechanically and electrically connected to the first printed circuit board 340 through the connection member 770.

In an embodiment, the first member 771 may correspond to at least a part of the first pad 571. For example, the first member 771, which is disposed on the peripheral part 792 of the first element 790-1, may be in contact with at least a part of the first pad 571 disposed on the peripheral part 512 of the first area 510. For example, in a state in which the second electronic component 702 is disposed on the first printed circuit board 340, the first member 771, which is disposed on the peripheral part 792 of the first element 790-1, may be in contact with the first pad 571 disposed on the fourth peripheral part 554 of the peripheral part 512 of the first area 510. The first pad 571, which is disposed on the first peripheral part 551, the second peripheral part 552, and the third peripheral part 553 of the peripheral part 512 of the first area 510, may not be in contact with the connection member 770 of the second electronic component 702.

In an embodiment, the first member 771 and the first pad 571, which are electrically connected to each other, may perform the first function.

In an embodiment, the second member 772 of the second electronic component 702 may correspond to the second pad 572 of the first printed circuit board 340. For example, in a state in which the second electronic component 702 is disposed on the first printed circuit board 340, in a case of being viewed from above the first printed circuit board 340, the second member 772 may overlap the second pad 572. The second member 772 may be in contact with the second pad 572. In an embodiment, the second member 772 may be electrically connected to the second pad 572 so as to perform the second function. For example, the second function may be the same as the first function.

In an embodiment, the third member 773 of the second electronic component 702 may correspond to the third pad 573 of the first printed circuit board 340. For example, in a state in which the second electronic component 702 is disposed on the first printed circuit board 340, in a case of being viewed from above the first printed circuit board 340, the third member 773 may overlap the third pad 573. The third member 773 may be in contact with the third pad 573. In an embodiment, the third member 773 may be electrically connected to the third pad 573 so as to perform the third function. For example, a signal (e.g., a data signal or an electric power signal), which is input or output from the second electronic component 702, may be delivered through the third member 773 and the third pad 573. However, the third function is not limited by the above-described example.

Figure 8:
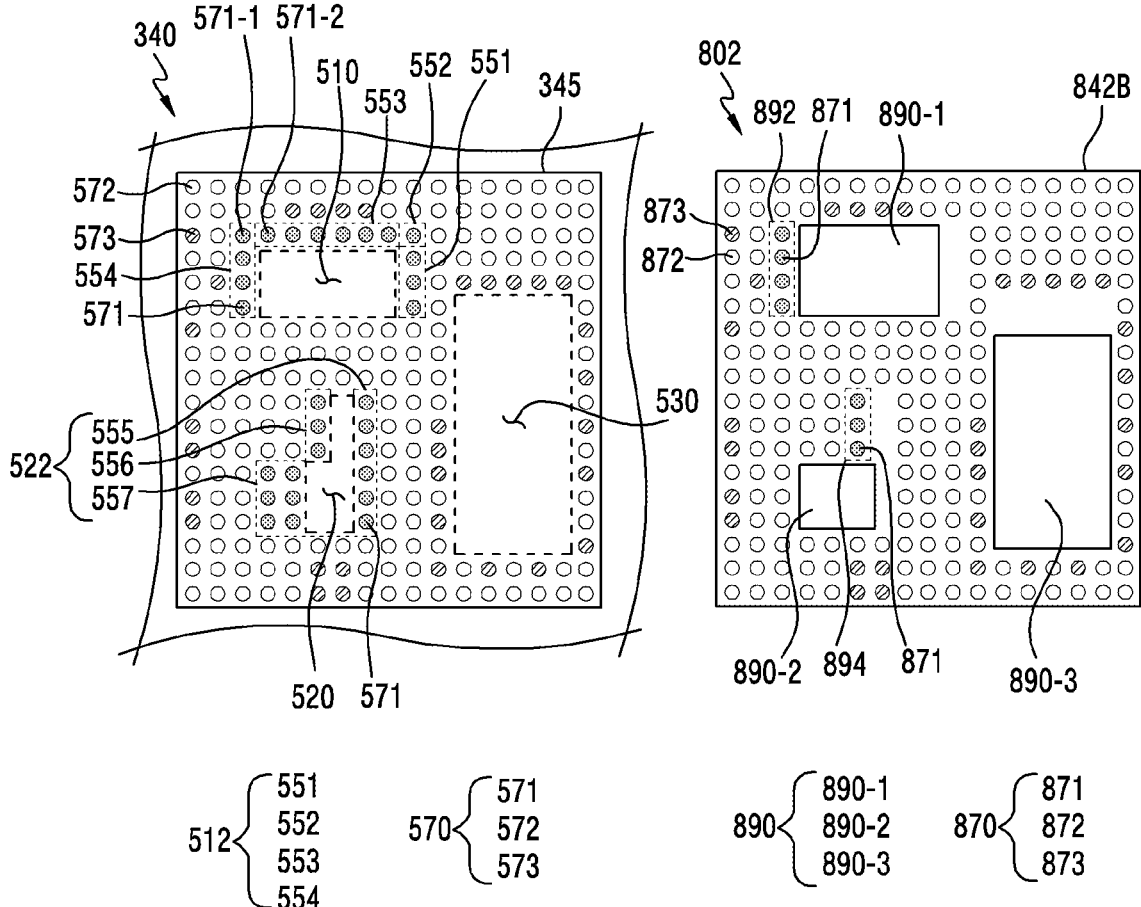
FIG. 8 illustrates a designated area of an example first printed circuit board and a second surface of an example third electronic component according to various embodiments.

FIG. 8 illustrates the designated area 345 of a first printed circuit board 340 and a second surface 842B of a third electronic component 802 according to various embodiments. FIG. 8 illustrates the second surface 842B of the third electronic component 802 projected in a direction (e.g., the—z-direction in FIG. 4) in a case in which the third electronic component 802 is seen from above for easy description of the disclosure.

Referring to FIG. 8, the third electronic component 802 (e.g., the electronic component 302 in FIG. 4) may include at least one electronic element 890 (e.g., the at least one electronic element 490 in FIG. 4) disposed on the second surface 842B (e.g., the second surface 442B in FIG. 4). The at least one electronic element 890 may include at least one of a first element 890-1, a second element 890-2, and/or a third element 890-3 (e.g., the sixth element 490-1 in FIG. 4). The third electronic component 802 may perform substantially the same function as the first electronic component 602 in FIG. 6 or the second electronic component 702 in FIG. 7, but may have a design different therefrom.

In an embodiment, the first printed circuit board 340 may be substantially the same as the first printed circuit board 340 in FIG. 6 or the first printed circuit board 340 in FIG. 7.

In an embodiment, the first area 510 of the first printed circuit board 340 may correspond to the first element 890-1. For example, in a state in which the third electronic component 802 is disposed on the first printed circuit board 340, in a case of being viewed from above the first printed circuit board 340, at least a part of the first area 510 may overlap the first element 890-1. In an embodiment, at least a part of the first element 890-1 may overlap the first area 510 and the peripheral part 512 of the first printed circuit board 340. For example, the first element 890-1 may overlap the first area 510 and the third peripheral part 553 of the peripheral part 512 of the first area 510. For example, the peripheral part 512 of the first area 510 may include at least one of the first peripheral part 551, the second peripheral part 552, the third peripheral part 553, and/or a fourth peripheral part 554.

In an embodiment, the second area 520 of the first printed circuit board 340 may correspond to the second element 890-2 of the third electronic component 802. For example, in a state in which the third electronic component 802 is disposed on the first printed circuit board 340, in a case of being viewed from above the first printed circuit board 340, at least a part of the second area 520 may overlap the second element 890-2. The second element 890-2 may overlap at least a part of the second area 520 and at least a part of the peripheral part 522 of the second area 520. For example, the second element 890-2 may overlap the seventh peripheral part 557 of the peripheral part 522 of the second area 520. For example, the peripheral part 522 of the second area 520 may include at least one of the fifth peripheral part 555, the sixth peripheral part 556 and/or the seventh peripheral part 557.

In an embodiment, the third area 530 of the first printed circuit board 340 may correspond to the third element 890-3 of the third electronic component 802. For example, in a state in which the third electronic component 802 is disposed on the first printed circuit board 340, in a case of being viewed from above the first printed circuit board 340, at least a part of the third area 530 may overlap the third element 890-3. For example, the third element 890-3 may have an area which is substantially the same as the area of the third area 530 or smaller than the area of the third area 530.

In an embodiment, the third electronic component 802 may include a connection member 870 (e.g., the connection member 470 in FIG. 4) disposed around the at least one electronic element 890. For example, the connection member 870 may be formed on the second surface 842B (e.g., the second surface 442B in FIG. 4) of the third electronic component 802.

In an embodiment, the connection member 870 may include at least one of a first member 871, a second member 872, and/or a third member 873. In an embodiment, the first member 871 may be disposed on a peripheral part 892 of the first element 890-1 and a peripheral part 894 of the second element 890-2. In an embodiment, the first member 871 may be designed as a port electrically connected to a ground. In an embodiment, the second member 872 or the third member 873 may be designed as a port for one of signals requiring electrical connection with the first printed circuit board 340, such as a power source, a control signal, a RF signal, or a ground.

In an embodiment, in a state in which the third electronic component 802 is disposed on the first printed circuit board 340, the connection member 870 may be in contact with at least a part of the pads 570 formed on the first printed circuit board 340. The third electronic component 802 may be mechanically and electrically connected to the first printed circuit board 340 through the connection member 870.

In an embodiment, the first member 871 may correspond to at least a part of the first pad 571. For example, the first member 871, which is disposed on the peripheral part 892 of the first element 890-1, may be in contact with at least a part of the first pad 571 disposed on the peripheral part 512 of the first area 510. For example, in a state in which the third electronic component 802 is disposed on the first printed circuit board 340, the first member 871, which is disposed on the peripheral part 892 of the first element 890-1, may be in contact with the first pad 571 disposed on the fourth peripheral part 554 of the peripheral part 512 of the first area 510. The first pad 571, which is disposed on the first peripheral part 551, the second peripheral part 552, and the third peripheral part 553 of the peripheral part 512 of the first area 510, may not be in contact with the connection member 870 of the third electronic component 802.

In an embodiment, the first member 871, which is disposed on the peripheral part 894 of the second element 890-2, may be in contact with at least a part of the first pad 571 disposed on the peripheral part 522 of the second area 520. In a state in which the third electronic component 802 is disposed on the first printed circuit board 340, the first member 871, which is disposed on the peripheral part 894 of the second element 890-2, may be in contact with at least a part of the first pad 571 disposed on the sixth peripheral part 556 of the peripheral part 522 of the second area 520. The first pad 571, which is disposed on the fifth peripheral part 555 and the seventh peripheral part 557 of the peripheral part 522 of the second area 520, may not be in contact with the connection member 870 of the third electronic component 802.

In an embodiment, the first member 871 and the first pad 571, which are electrically connected to each other, may perform the first function.

In an embodiment, the second member 872 of the third electronic component 802 may correspond to the second pad 572 of the first printed circuit board 340. For example, in a state in which the third electronic component 802 is disposed on the first printed circuit board 340, in a case of being viewed from above the first printed circuit board 340, the second member 872 may overlap the second pad 572. The second member 872 may overlap the second pad 572. In an embodiment, the second member 872 may be electrically connected to the second pad 572 to perform the second function. For example, the second function may be the same as the first function.

In an embodiment, the third member 873 of the third electronic component 802 may correspond to the third pad 573 of the first printed circuit board 340. For example, in a state in which the third electronic component 802 is disposed on the first printed circuit board 340, in a case of being viewed from above the first printed circuit board 340, the third member 873 may overlap the third pad 573. The third member 873 may be in contact with the third pad 573. In an embodiment, the third member 873 may be electrically connected to the third pad 573 to perform the third function. For example, a signal (e.g., a data signal or an electric power signal), which is input or output from the third electronic component 802, may be delivered through the third member 873 and the third pad 573. However, the third function is not limited by the above-described example.

Figure 9:
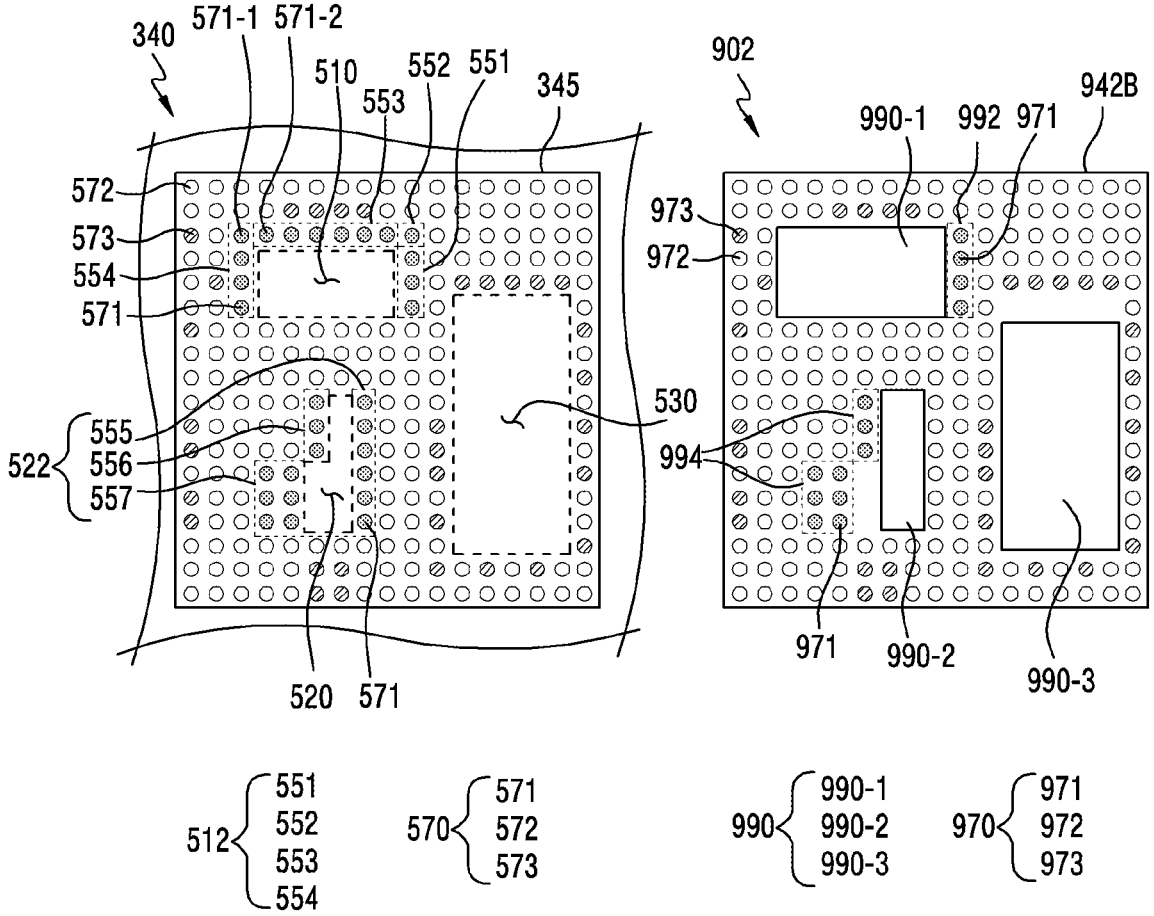
FIG. 9 illustrates a designated area of an example first printed circuit board and a second surface of an example fourth electronic component according to various embodiments.

FIG. 9 illustrates the designated area 345 of the first printed circuit board 340 and a second surface 942B of a fourth electronic component 902 according to various embodiments. FIG. 9 illustrates the second surface 942B of the fourth electronic component 902 projected in a direction (e.g., the—z-direction in FIG. 4) in case that the fourth electronic component 902 is seen from above for easy description of the disclosure.

Referring to FIG. 9, the fourth electronic component 902 (e.g., the electronic component 302 in FIG. 4) may include at least one electronic element 990 (e.g., the at least one electronic element 490 in FIG. 4) disposed on the second surface 942B (e.g., the second surface 442B in FIG. 4). The at least one electronic element 990 may include at least one of a first element 990-1, a second element 990-2, and/or a third element 990-3 (e.g., the sixth element 490-1 in FIG. 4). The fourth electronic component 902 may perform substantially the same function as the first electronic component 602 in FIG. 6, the second electronic component 702 in FIG. 7, or the third electronic component 802 in FIG. 8, but may have a design different therefrom.

In an embodiment, the first printed circuit board 340 may be substantially the same as the first printed circuit board 340 in FIG. 6, the first printed circuit board 340 in FIG. 7, or the first printed circuit board 340 in FIG. 8.

In an embodiment, the first area 510 of the first printed circuit board 340 may correspond to the first element 990-1. For example, in a state in which the fourth electronic component 902 is disposed on the first printed circuit board 340, in a case of being viewed from above the first printed circuit board 340, at least a part of the first area 510 may overlap the first element 990-1. In an embodiment, at least a part of the first element 990-1 may overlap the first area 510 and the peripheral part 512 of the first printed circuit board 340. For example, the first element 990-1 may overlap the first area 510, and the third peripheral part 553 and the fourth peripheral part 554 of the peripheral part 512 of the first area 510. For example, the peripheral part 512 of the first area 510 may include at least one of the first peripheral part 551, the second peripheral part 552, the third peripheral part 553, and/or the fourth peripheral part 554.

In an embodiment, the second area 520 of the first printed circuit board 340 may correspond to the second element 990-2 of the fourth electronic component 902. For example, in a state in which the fourth electronic component 902 is disposed on the first printed circuit board 340, in a case of being viewed from above the first printed circuit board 340, at least a part of the second area 520 may overlap the second element 990-2. The second element 990-2 may overlap at least a part of the second area 520 and at least a part of the peripheral part 522 of the second area 520. For example, the second element 990-2 may overlap the fifth peripheral part 555 of the peripheral part 522 of the second area 520.

In an embodiment, the third area 530 of the first printed circuit board 340 may correspond to the third element 990-3 of the fourth electronic component 902. For example, in a state in which the fourth electronic component 902 is disposed on the first printed circuit board 340, the third area 530 may overlap the third element 990-3. The third element 990-3 may have an area which is substantially the same as the area of the third area 530 or smaller than the area of the third area 530.

In an embodiment, the fourth electronic component 902 may include a connection member 970 (e.g., the connection member 470 in FIG. 4) surrounding the at least one electronic element 990. The connection member 970 may be formed on the second surface 942B (e.g., the second surface 442B in FIG. 4) of the fourth electronic component 902.

In an embodiment, the connection member 970 may include a first member 971, a second member 972, and a third member 973. In an embodiment, the first member 971 may be disposed on a peripheral part 992 of the first element 990-1 and a peripheral part 994 of the second element 990-2. In an embodiment, the first member 971 may be designed as a port electrically connected to a ground. In an embodiment, the second member 972 or the third member 973 may be designed as a port for one of signals requiring electrical connection with the first printed circuit board 340, such as a power source, a control signal, a RF signal, or a ground.

In an embodiment, in a state in which the fourth electronic component 902 is disposed on the first printed circuit board 340, the connection member 970 may be in contact with at least a part of the pads 570 formed on the first printed circuit board 340. The fourth electronic component 902 may be mechanically and electrically connected to the first printed circuit board 340 through the connection member 970.

In an embodiment, the first member 971 may correspond to at least a part of the first pad 571. For example, the first member 971, which is disposed on the peripheral part 992 of the first element 990-1, may be in contact with at least a part of the first pad 571 disposed on the peripheral part 512 of the first area 510. For example, in a state in which the fourth electronic component 902 is disposed on the first printed circuit board 340, the first member 971, which is disposed on the peripheral part 992 of the first element 990-1, may be in contact with the first pad 571 disposed on the first peripheral part 551 and the second peripheral part 552 of the peripheral part 512 of the first area 510. The first pad 571, which is disposed on the third peripheral part 553 and the fourth peripheral part 554 of the peripheral part 512 of the first area 510, may not be in contact with the connection member 970 of the fourth electronic component 902.

In an embodiment, the first member 971, which is disposed on the peripheral part 994 of the second element 990-2, may be in contact with at least a part of the first pad 571 disposed on the peripheral part 522 of the second area 520. In a state in which the fourth electronic component 902 is disposed on the first printed circuit board 340, the first member 971, which is disposed on the peripheral part 994 of the second element 990-2, may be in contact with at least a part of the first pad 571 disposed on the sixth peripheral part 556 and the seventh peripheral part 557 of the peripheral part 522 of the second area 520. The first pad 571 disposed on the fifth peripheral part 555 of the peripheral part 522 of the second area 520 may not be in contact with the connection member 970 of the fourth electronic component 902.

In an embodiment, the first member 971 and the first pad 571, which are electrically connected to each other, may perform the first function.

In an embodiment, the second member 972 of the fourth electronic component 902 may correspond to the second pad 572 of the first printed circuit board 340. For example, in a state in which the fourth electronic component 902 is disposed on the first printed circuit board 340, in a case of being viewed from above the first printed circuit board 340, the second member 972 may overlap the second pad 572. The second member 972 may overlap the second pad 572. In an embodiment, the second member 972 may be electrically connected to the second pad 572 to perform the second function. For example, the second function may be the same as the first function.

In an embodiment, the third member 973 of the fourth electronic component 902 may correspond to the third pad 573 of the first printed circuit board 340. For example, in a state in which the fourth electronic component 902 is disposed on the first printed circuit board 340, in a case of being viewed from above the first printed circuit board 340, the third member 973 may overlap the third pad 573. The third member 973 may be in contact with the third pad 573. In an embodiment, the third member 973 may be electrically connected to the third pad 573 to perform the third function. For example, a signal (e.g., a data signal or an electric power signal), which is input or output from the fourth electronic component 902, may be delivered through the third member 973 and the third pad 573. However, the third function is not limited by the above-described example.

In an embodiment, the second surface 942B of the fourth electronic component 902 may be implemented to have an area smaller than the illustrated area. For example, the second surface 942B of the fourth electronic component 902 may have an area smaller than the area of the designated area 345 of the first printed circuit board 340. The above description may also be substantially and equally applied to the first, the second, and the third electronic components 602, 702, and 802.

In an embodiment, in a case in which the first electronic component 602, the second electronic component 702, the third electronic component 802, or the fourth electronic component 902 is disposed on the first printed circuit board 340, a pad (or pads) of the first pad 571 of the first printed circuit board 340, which is in contact with a connection member of an electronic component, may, for example, be referred to as "at least one first pad".

In an embodiment, in a case in which the first electronic component 602, the second electronic component 702, the third electronic component 802, or the fourth electronic component 902 is disposed on the first printed circuit board 340, a pad (or pads) of the first pad 571 of the first printed circuit board 340, which is not in contact with the connection member of the electronic component, may, for example, be referred to as "at least one second pad".

In an embodiment, in a case in which the first electronic component 602, the second electronic component 702, the third electronic component 802, or the fourth electronic component 902 is disposed on the first printed circuit board 340, a pad (or pads) of the second pad 572 of the first printed circuit board 340, which is in contact with the connection member of the electronic component, may, for example, be referred to as "at least one third pad".

In an embodiment, in a case in which the first electronic component 602, the second electronic component 702, the third electronic component 802, or the fourth electronic component 902 is disposed on first the printed circuit board

340, a pad (or pads) of the third pad 573 of the first printed circuit board 340, which is in contact with the connection member of the electronic component, may, for example, be referred to as "at least one fourth pad".

Figure 10A:
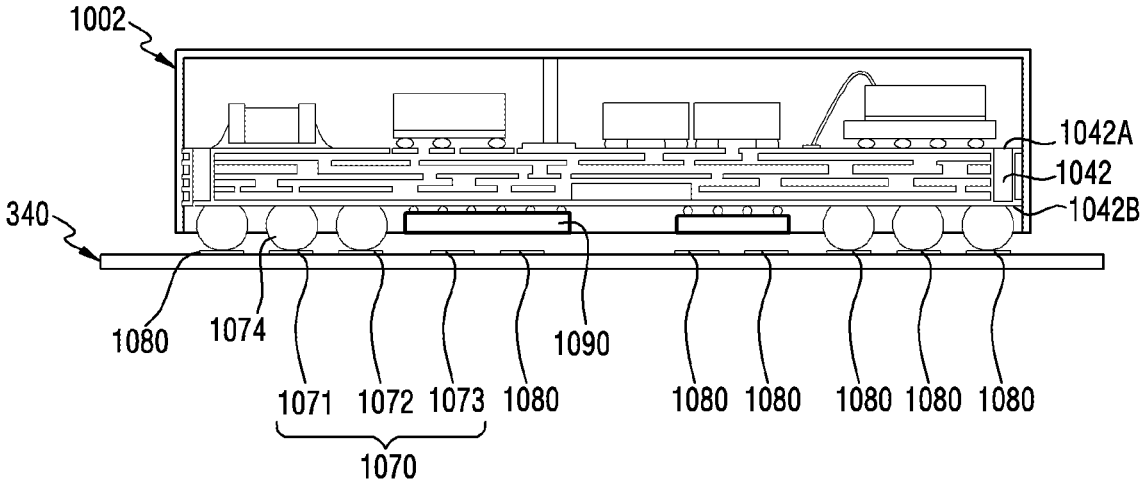
FIG. 10A illustrates an electronic component disposed on a first printed circuit board of an example electronic device according to various embodiments.

FIG. 10A illustrates an electronic component 1002 disposed on the first printed circuit board 340 of the electronic device 100 according to various embodiments.

Figure 10B:
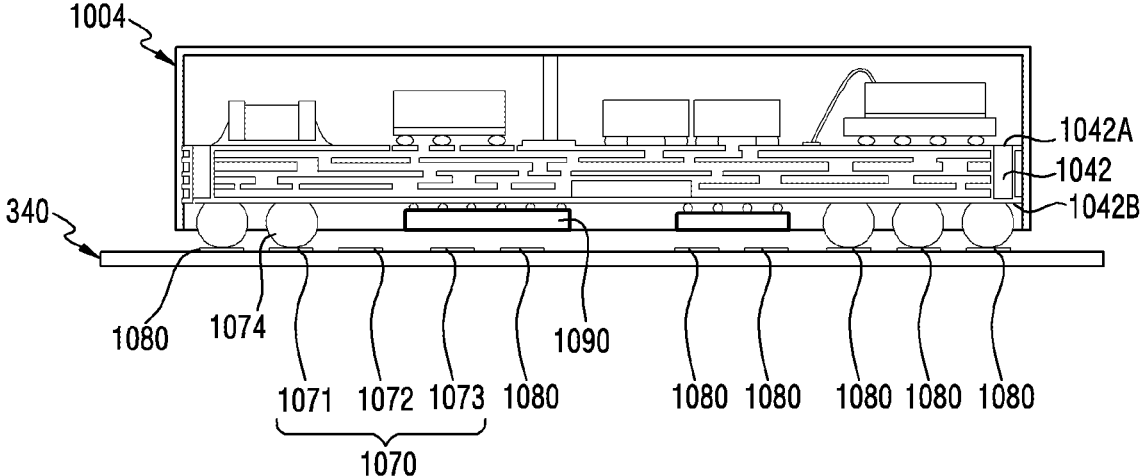
FIG. 10B illustrates an electronic component disposed on a first printed circuit board of an example electronic device according to various embodiments.

FIG. 10B illustrates an electronic component 1004 disposed on the first printed circuit board 340 of the electronic device 100 according to various embodiments.

In an embodiment, an electronic component 1002 and an electronic component 1004 may perform substantially the same function.

Referring to FIG. 10A, the first printed circuit board 340 of the electronic device 100 may include a designated area (e.g., the designated area 345 in FIG. 3) on which the electronic component 1002 (e.g., the first electronic component 602 in FIG. 6, the second electronic component 702 in FIG. 7, the third electronic component 802 in FIG. 8, or the fourth electronic component 902 in FIG. 9) may be disposed. The first printed circuit board 340 may include pads 1070 (e.g., the pads 570 in FIG. 5) formed in the designated area. The pads 1070 may be arranged between a printed circuit board 1042 of the electronic component 1002 and the first printed circuit board 340 of the electronic device 100. In an embodiment, at least a part of the pads 1070 may be electrically connected to a connection member 1074 of the electronic component 1002. In an embodiment, in a case in which the connection member 1074 is implemented as a solder ball, the diameter thereof may be about 140 μm, but is not limited thereto. The connection member 1074 may be formed on the second surface 1042B oriented in a direction opposite to the first surface 1042A of the printed circuit board 1042 of the electronic component 1002. The electronic component 1002 may be disposed on the first printed circuit board 340 such that the second surface 1042B faces the first printed circuit board 340. In an embodiment, by applying a solder paste to the pads 1070, and disposing the electronic component 1002 on the first printed circuit board 340 such that the connection member 1074 is positioned on at least one first pad 1071 and then applying heat thereto, the electronic component 1002 may be physically and electrically connected to the first printed circuit board 340. In an embodiment, a solder paste may not be applied to pads (e.g., the at least one third pad 1073 in FIG. 10A) not coupled to the connection member 1074.

According to an embodiment, the pads 1070 may include at least one first pad 1071, at least one second pad 1072, or at least one third pad 1073. In an embodiment, the at least one first pad 1071 and the at least one second pad 1072 may be coupled to the connection member 1074 of the electronic component 1002.

In an embodiment, the at least one first pad 1071 and/or the at least one second pad 1072 may correspond to a pad (e.g., the first pad 571 disposed on the second peripheral part 552, the third peripheral part 553, and the fourth peripheral part 554 in FIG. 6) of the first pads 571 in FIG. 6, which is connected to the first member 671, a pad of the second pads 572, which is connected to the second member 672, or a pad of the third pads 573, which is connected to the third member 673. In an embodiment, the connection member 1074 may correspond to the first member 671, the second member 672, or the third member 673 in FIG. 6.

In an embodiment, the at least one first pad 1071 and/or the at least one second pad 1072 may correspond to a pad (e.g., the first pad 571 disposed on the fourth peripheral part 554 in FIG. 7) of the first pads 571 in FIG. 7, which is coupled to the first member 771, a pad of the second pads 572, which is connected to the second member 772, or a pad of the third pads 573, which is connected to the third member 773. In an embodiment, the connection member 1074 may correspond to the first member 771, the second member 772, or the third member 773 in FIG. 7.

In an embodiment, the at least one first pad 1071 and/or the at least one second pad 1072 may correspond to a pad (e.g., the first pad 571 disposed on the fourth peripheral part 554 in FIG. 8) of the first pads 571 in FIG. 8, which is coupled to the first member 871, a pad of the second pads 572, which is connected to the second member 872, or a pad of the third pads 573, which is connected to the third member 873. In an embodiment, the connection member 1074 may correspond to the first member 871, the second member 872, and the third member 873 in FIG. 8.

In an embodiment, the at least one first pad 1071 and/or the at least one second pad 1072 may correspond to a pad (e.g., the first pad 571 disposed on the first peripheral part 551 and the second peripheral part 552 in FIG. 9) of the first pads 571 in FIG. 9, which is coupled to the first member 971, a pad of the second pads 572, which is connected to the second member 972, or a pad of the third pads 573, which is connected to the third member 973. In an embodiment, the connection member 1074 may correspond to the first member 971, the second member 972, or the third member 973.

In an embodiment, the at least one third pad 1073 may not be coupled to the connection member 1074 of the electronic component 1002. In an embodiment, in a state in which the electronic component 1002 is disposed on the first printed circuit board 340, the at least one third pad 1073 may be spaced apart from at least one electronic element 1090. For example, the distance between the at least one third pad 1073 and the at least one electronic element 1090 may be about 30 μm to 50 μm, but is not limited thereto. For example, in a state in which the electronic component 1002 is disposed on the first printed circuit board 340, the at least one third pad 1073 may also be in contact with at least one electronic element 1090. However, in this case, in order for the at least one electronic element 1090 to operate normally, a solder paste may not be applied to the at least one third pad 1073.

In an embodiment, in a state in which the electronic component 1002 is disposed on the first printed circuit board 340, in a case of being viewed from above the first printed circuit board 340, the at least one third pad 1073 may overlap at least one electronic element 1090. In an embodiment, in a case in which at least one electronic element 1090 is implemented to have an area smaller than that of the illustrated example, the at least one third pad 1073 may also not overlap the at least one electronic element 1090.

In an embodiment, the at least one third pad 1073 may correspond to the first pad 571 which is not coupled to the connection member 670 of the first electronic component 602 illustrated in FIG. 6. As another example, the at least one third pad 1073 may correspond to the first pad 571 disposed on the first peripheral part 551 in FIG. 6. In this case, the at least one electronic element 1090 may correspond to the first element 690-1. In an embodiment, the at least one third pad 1073 may include the first pad 571 disposed on the sixth peripheral part 556 in FIG. 6. In this case, the at least one electronic element 1090 may correspond to the second element 690-2.

In an embodiment, the at least one third pad 1073 may correspond to the first pad 571 which is not coupled to the connection member 770 of the second electronic component 702 illustrated in FIG. 7. In an embodiment, the at least one third pad 1073 may correspond to the first pad 571 disposed on the first peripheral part 551, the second peripheral part 552, and the third peripheral part 553 in FIG. 7. In this case, the at least one electronic element 1090 may correspond to the first element 790-1. In an embodiment, the at least one third pad 1073 may correspond to the first pad 571 disposed on the peripheral part 522 of the second area 520 in FIG. 7. In this case, the at least one electronic element 1090 may correspond to the second element 790-2 in FIG. 7.

In an embodiment, the at least one third pad 1073 may correspond to the first pad 571 which is not coupled to the connection member 870 of the third electronic component 802 illustrated in FIG. 8. For example, the at least one third pad 1073 may correspond to the first pad 571 disposed on the first peripheral part 551, the second peripheral part 552, and the third peripheral part 553 in FIG. 8. In this case, the at least one electronic element 1090 may correspond to the first element 890-1. In an embodiment, the at least one third pad 1073 may correspond to the first pad 571 disposed on the fifth peripheral part 555 and the seventh peripheral 557 in FIG. 8. In this case, the at least one electronic element 1090 may correspond to the second element 890-2 in FIG. 8.

In an embodiment, the at least one third pad 1073 may correspond to the first pad 571 which is not coupled to the connection member 970 of the fourth electronic component 902 illustrated in FIG. 9. For example, the at least one third pad 1073 may correspond to the first pad 571 disposed on the third peripheral part 553 and the fourth peripheral 554 in FIG. 9. In this case, the at least one electronic element 1090 may correspond to the first element 990-1 in FIG. 9. In an embodiment, the at least one third pad 1073 may correspond to the first pad 571 disposed on the fifth peripheral part 555 in FIG. 9. In this case, the at least one electronic element 1090 may correspond to the second element 890-2 in FIG. 9.

Referring to FIG. 10A and FIG. 10B, the connection state between the pads 1070 and the connection member 1704 of the first printed circuit board 340 according to various embodiments may be changed according to an electronic component disposed on the first printed circuit board 340. For example, as illustrated in FIG. 10A, in a case in which the electronic component 1002 is disposed on the first printed circuit board 340, the at least one first pad 1071 and the at least one second pad 1072 may be connected to the connection member 1074 of the electronic component 1002. Differently therefrom, as illustrated in FIG. 10B, in a case in which the electronic component 1004 is disposed on the first printed circuit board 340, the at least one first pad 1071 is connected to the connection member 1074 of the electronic component 1004, and the at least one second pad 1072 may not be connected to the connection member 1074 of the electronic component 1004. The above description is also substantially and equally applicable to the pad 571-1 and the pad 571-2 illustrated in FIG. 5 and FIG. 6. Referring to FIG. 6, in a case in which the first electronic component 602 is disposed, the pad 571-1 and the pad 571-2 may be coupled to the first member 671 of the first electronic component 602. Differently therefrom, referring to FIG. 7, in a case in which the second electronic component 702 is disposed, the pad 571-1 may be coupled to the first member 771 of the second electronic component 702, and the pad 571-2 may not be coupled to the connection member 770 of the second electronic component 702. In an embodiment, referring to FIG. 9, the pad 571-1 and the pad 571-2 may not be coupled to the connection member 970 of the fourth electronic component 902.

As described above, some of the pads of the first printed circuit board 340, which may be coupled to an electronic component, and the other pads which may not be coupled thereto, are called optional pads. For example, referring to FIG. 5, the optional pads may include the first pad 571 disposed on the peripheral part 512 of the first area 510 and/or the first pad 571 disposed on the peripheral part 522 of the second area 520.

Electronic components, which are arranged on the first printed circuit board 340, may have different designs even though having the same function. For example, as the first, the second, the third, and the fourth electronic components 602, 702, 802, and 902 illustrated in FIGS. 6, 7, 8, and 9, respectively, electronic components may have the same function, the area and the number of electronic elements thereof may be different, or the kind and/or the number of connection members thereof, which are arranged in the peripheral parts of the electronic elements, may be different. The electronic device 100 according to various embodiments may have electronic components arranged therein, which have the same function and different designs, through the optional pads without a design change to the first printed circuit board 340.

The description of the pads 1070 described above may be applied to at least one of other pads 1080 illustrated in FIG. 10A and FIG. 10B in substantially the same manner.

In the above-described FIG. 5 through FIG. 10B, the optional pads have been described as having a first function, for example, a function for connecting same to a ground pin (or a ground ball) of an electronic component, but are not limited thereto. For example, pads connected to I/O pins, to which input/output signals of electronic components are transmitted, may also be implemented as an optional pad in substantially the same manner In order to operate an electronic component in the electronic device 100, in a case in which the number of I/O terminals required by the first printed circuit board 340 is m, I/O pads of the first printed circuit board may be implemented to have (m+n) numbers. In this case, in a case in which the positions of the connection members for transmitting input/output signals of electronic components overlap I/O pads of a printed circuit board, the I/O pads may be implemented to have m numbers or more, or (m+n) numbers or less, so as to give degree of freedom in a design of an electronic component.

An electronic device (e.g., the electronic device 100 in FIG. 3) according to various embodiments described above may include a first printed circuit board (e.g., the first printed circuit board 340 in FIG. 3) including a designated area (e.g., the designated area 345 in FIG. 3), the first printed circuit board including at least one first pad (e.g., the first pad 571 in FIG. 5) and at least one second pad (e.g., the second pad 572 in FIG. 5) which are formed on the designated area, wherein in a case in which a first radio frequency (RF) front end module (e.g., the first electronic component 602 in FIG. 6, the second electronic component 702 in FIG. 7, the third electronic component 802 in FIG. 8, or the fourth electronic component 902 in FIG. 9) is disposed on the designated area of the first printed circuit board, the at least one first pad may be in contact with the first RF front end module and the at least one second pad may not be in contact with the first RF front end module, and in a case in which a second RF front end module (e.g., one except for the first RF front end module of the first electronic component 602 in FIG. 6, the second electronic component 702 in FIG. 7, the third electronic component 802 in FIG. 8, or the fourth electronic component 902 in FIG. 9) is disposed on the designated area of the first printed circuit board, the at least one first pad and the at least one second pad may be in contact with the second RF front end module.

In an embodiment, the designated area of the first printed circuit board may include a first area (e.g., the first area 510, the second area 520, and the third area 530 in FIG. 5) and a second area (e.g., the remaining areas except for the first area 510, the second area 520, and the third area 530 of the designated area 345 in FIG. 5), the at least one first pad and the at least one second pad may not be arranged in the first area, and in a case in which the first RF front end module or the second RF front end module is disposed on the first printed circuit board, in a case of being viewed from above the first printed circuit board, the first area may overlap at least one electronic element (e.g., the at least one first electronic element 480 and/or the at least one second electronic element 490 in FIG. 4) included in the first RF front end module and the second RF front end module.

In an embodiment, the at least one first pad and the at least one second pad may be arranged in a peripheral part of the first area of the designated area.

In an embodiment, in a case in which the first RF front end module or the second RF front end module is disposed on the first printed circuit board, in a case of being viewed from above the first printed circuit board, at least one electronic element (e.g., the at least one first electronic element 480 and/or the at least one second electronic element 490 in FIG. 4) included in the first RF front end module and the second RF front end module may overlap the at least one second pad.

In an embodiment, in a case in which a third RF front end module (e.g., one except for the first and the second RF front end module of the first electronic component 602 in FIG. 6, the second electronic component 702 in FIG. 7, the third electronic component 802 in FIG. 8, or the fourth electronic component 902 in FIG. 9) is disposed on the designated area of the first printed circuit board, the at least one first pad and the at least one second pad may not be in contact with the third RF front end module.

In an embodiment, the first RF front end module may be grounded to the first printed circuit board through the at least one first pad, and the second RF front end module may be grounded with the first printed circuit board through the at least one first pad and the at least one second pad.

In an embodiment, the first printed circuit board may include at least one third pad (e.g., the third pad 573 in FIG. 5), in a state in which the first RF front end module is disposed on the first printed circuit board, the at least one third pad may be in contact with the first RF front end module, and in a state in which the second RF front end module is disposed on the first printed circuit board, the at least one third pad may be in contact with the second RF front end module.

In an embodiment, the first RF front end module or the second RF front end module may be grounded to the first printed circuit board through the at least one third pad.

In an embodiment, the first printed circuit board may include at least one fourth pad (e.g., a pad (or pads) of the third pad 573 of the printed circuit board 340, which is in contact with a connection member of an electronic component), in a state in which the first RF front end module is disposed on the first printed circuit board, the at least one fourth pad may be in contact with the first RF front end module and an input/output signal of the first RF front end module may be delivered through the at least one fourth pad, and in a state in which the second RF front end module is disposed on the first printed circuit board, the at least one fourth pad may be in contact with the second RF front end module and an input/output signal of the second RF front end module may be delivered through the at least one fourth pad.

In an embodiment, each of the first RF front end module and the second RF front end module may include a power amplifier (PA), a low noise amplifier (LNA), a filter, and a switch.

In an embodiment, the first printed circuit board may include at least one fourth pad disposed on the designated area, in a case in which the first RF front end module is disposed on the designated area of the first printed circuit board, the at least one fourth pad may be in contact with the first RF front end module, the at least one first pad may be electrically connected to a ground, and the at least one fourth pad may be electrically connected to at least one of the PA, the LNA, the filter, and the switch, and in a case in which the second RF front end module is disposed on the designated area of the first printed circuit board, the at least one fourth pad may be in contact with the second RF front end module, the at least one first pad and the at least one second pad may be electrically connected to the ground, and the at least one fourth pad may be electrically connected to at least one of the PA, the LNA, the filter, and the switch.

In an embodiment, the first RF front end module may include at least one connection member (e.g., the connection member 470 in FIG. 4), and in a case in which the first RF front end module is disposed on the first printed circuit board, a first member (e.g., the first member 671 in FIG. 6, the first member 771 in FIG. 7, the first member 871 in FIG. 8, or the first member 971 in FIG. 9) of the at least one connection member may be in contact with the at least one first pad.

In an embodiment, the at least one connection member may include a solder ball.

In an embodiment, the second RF front end module may include multiple connection members, and in a case in which the second RF front end module is disposed on the first printed circuit board, a first member of the multiple connection members may be in contact with the at least one first pad and a second member of the multiple connection members may be in contact with the at least one second pad.

In an embodiment, in a case in which the first RF front end module is disposed on the first printed circuit board, an input/output signal of the first RF front end module may be delivered through the at least one first pad, and in a case in which the second RF front end module is disposed on the first printed circuit board, an input/output signal of the second RF front end module may be delivered through the at least one first pad and the at least one second pad.

In an embodiment, the first RF front end module and the second RF front end module may include a second printed circuit board (e.g., the second printed circuit board 442 in FIG. 4) including a first surface and a second surface (e.g., the second surface 442B in FIG. 4) oriented in a direction opposite to the first surface (e.g., the first surface 442A in FIG. 4), and, in a state in which the first RF front end module or the second RF front end module is disposed on the first printed circuit board, the second surface may face the first printed circuit board.

In an embodiment, the first RF front end module and the second RF front end module may further include at least one electronic element (e.g., the at least one first electronic element 480 in FIG. 4) disposed on the first surface of the second printed circuit board.

In an embodiment, a display (e.g., the display 101 in FIG. 1) forming at least a part of the front surface (e.g., the front surface 110A in FIG. 1) of the electronic device, and a housing (e.g., the housing 110 in FIG. 1) forming the side surface (e.g., the side surface 110C in FIG. 1) and the rear surface (e.g., the rear surface 110B in FIG. 1) of the electronic device, may be included therein, and the first printed circuit board may be disposed in a space formed by the housing between the display and the housing.

An electronic device (e.g., the electronic device 100 in FIG. 3) according to various embodiments described above may include a first printed circuit board (e.g., the first printed circuit board 340 in FIG. 3) and an RF front end module (e.g., the electronic component 302 in FIG. 4) disposed on a designated area (e.g., the designated area 345 in FIG. 3) of the first printed circuit board, wherein the first printed circuit board may include multiple pads (e.g., the pads 570 in FIG. 5) arranged on the remaining areas except for a first area (e.g., the first area 510, the second area 520, and the third area 530 in FIG. 5) of the designated area, the multiple pads of the first printed circuit board may include multiple first ground pads (e.g., the first pad 571 disposed on the peripheral parts of the first area 510 and the second area 520 in FIG. 5) disposed on the peripheral part of the first area, the multiple first ground pads may include at least one first ground pad and at least one second ground pad, the RF front end module may include a second printed circuit board (e.g., the second printed circuit board 442 in FIG. 4) including a first surface (e.g., the first surface 442A in FIG. 4) and a second surface (e.g., the second surface 442B in FIG. 4) oriented in a direction opposite to the first surface and facing the first printed circuit board, at least one first electronic element (component) (e.g., the at least one first electronic element 480 in FIG. 4) disposed on the first surface, at least one second electronic element (e.g., the at least one second electronic element 490 in FIG. 4) disposed at a position corresponding to the first area on the second surface, and multiple connection members (e.g., the connection member 470 in FIG. 4) arranged between the second surface and the first printed circuit board and configured to electrically connect the RF front end module and the multiple pads of the first printed circuit board, the multiple connection members may include at least one first ground connection member (e.g., the first member 671 in FIG. 6, the first member 771 in FIG. 7, the first member 871 in FIG. 8, or the first member 971 in FIG. 9) disposed on a peripheral part of the at least one second electronic element, and in a case in which the RF front end module is disposed on the first printed circuit board, the at least one first ground connection member may be in contact with the at least one first ground pad, and the at least one second ground pad may not be in contact with the multiple connection members of the RF front end module.

In an embodiment, the multiple pads of the first printed circuit board may include multiple second ground pads (e.g., the second pad 572 in FIG. 5) different from the multiple first ground pads, the RF front end module may include a second ground connection member (e.g., the second member 672 in FIG. 6, the second member 772 in FIG. 7, the second member 872 in FIG. 8, or the second member 972 in FIG. 9) different from the first ground connection member, the second ground connection member may be electrically connected to the multiple second ground pads, the at least one second ground pad may overlap the at least one second electronic element, and the at least one second ground pad may be spaced apart from the at least one second electronic element.

Figure 11:
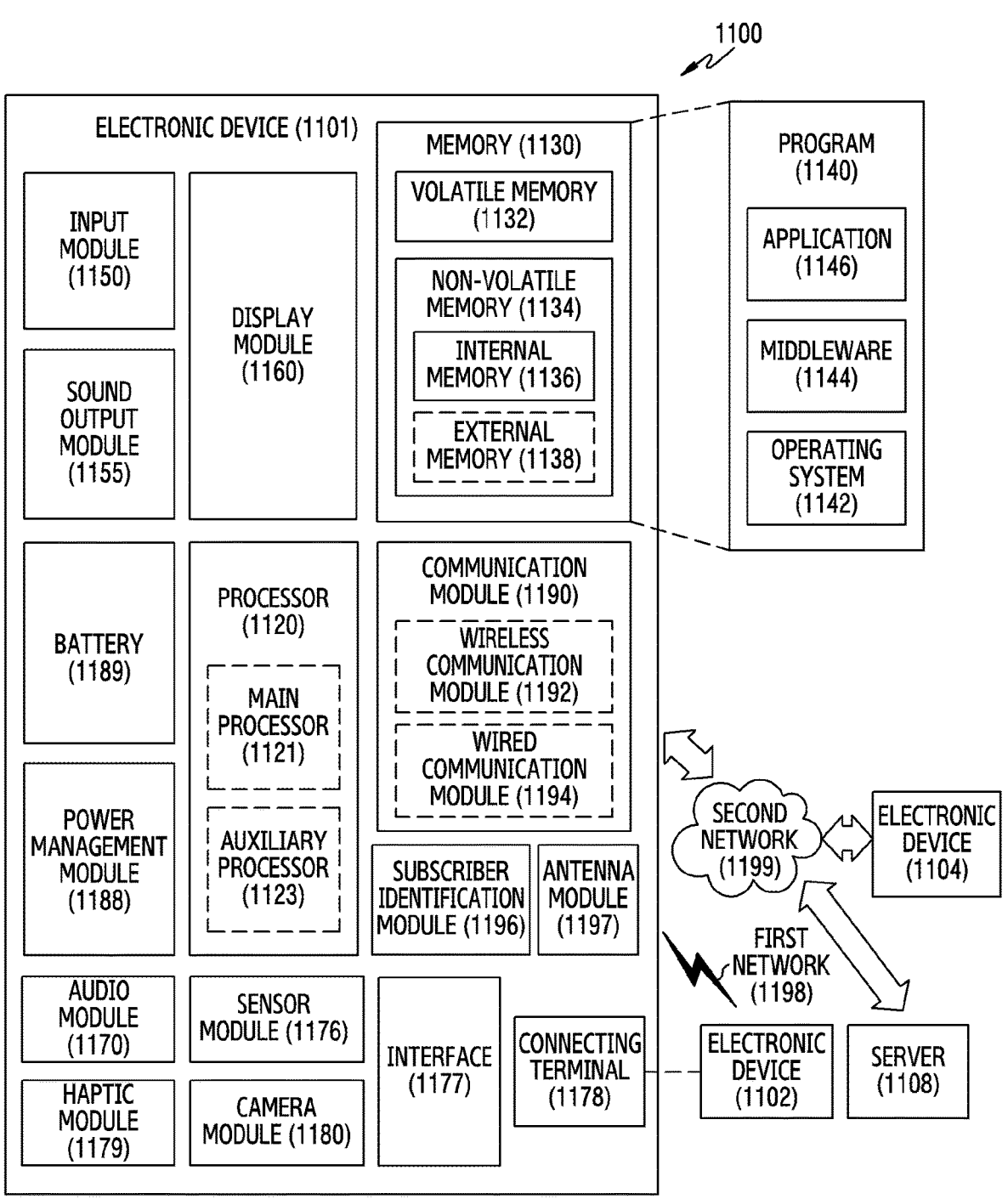
FIG. 11 is a block diagram of an example electronic device in a network environment according to various embodiments.

FIG. 11 is a block diagram of an example electronic device 1101 in a network environment 1100 according to various embodiments.

Referring to FIG. 11, the electronic device 1101 in the network environment 1100 may communicate with an electronic device 1102 via a first network 1198 (e.g., a short-range wireless communication network), or at least one of an electronic device 1104 or a server 1108 via a second network 1199 (e.g., a long-range wireless communication network). According to an embodiment, the electronic device 1101 may communicate with the electronic device 1104 via the server 1108. According to an embodiment, the electronic device 1101 may include a processor 1120, memory 1130, an input module 1150, a sound output module 1155, a display module 1160, an audio module 1170, a sensor module 1176, an interface 1177, a connecting terminal 1178, a haptic module 1179, a camera module 1180, a power management module 1188, a battery 1189, a communication module 1190, a subscriber identification module (SIM) 1196, or an antenna module 1197. In various embodiments, at least one of the components (e.g., the connecting terminal 1178) may be omitted from the electronic device 1101, or one or more other components may be added in the electronic device 1101. In various embodiments, some of the components (e.g., the sensor module 1176, the camera module 1180, or the antenna module 1197) may be implemented as a single component (e.g., the display module 1160).

The processor 1120 may execute, for example, software (e.g., a program 1140) to control at least one other component (e.g., a hardware or software component) of the electronic device 1101 coupled with the processor 1120, and may perform various data processing or computation. According to an embodiment, as at least part of the data processing or computation, the processor 1120 may store a command or data received from another component (e.g., the sensor module 1176 or the communication module 1190) in volatile memory 1132, process the command or the data stored in the volatile memory 1132, and store resulting data in non-volatile memory 1134. According to an embodiment, the processor 1120 may include a main processor 1121 (e.g., a central processing unit (CPU) or an application processor (AP)), or an auxiliary processor 1123 (e.g., a graphics processing unit (GPU), a neural processing unit (NPU), an image signal processor (ISP), a sensor hub processor, or a communication processor (CP)) that is operable independently from, or in conjunction with, the main processor 1121. For example, when the electronic device 1101 includes the main processor 1121 and the auxiliary processor 1123, the auxiliary processor 1123 may be adapted to consume less power than the main processor 1121, or to be specific to a specified function. The auxiliary processor 1123 may be implemented as separate from, or as part of the main processor 1121.

The auxiliary processor 1123 may control at least some of functions or states related to at least one component (e.g., the display module 1160, the sensor module 1176, or the communication module 1190) among the components of the electronic device 1101, instead of the main processor 1121 while the main processor 1121 is in an inactive (e.g., sleep) state, or together with the main processor 1121 while the main processor 1121 is in an active state (e.g., executing an application). According to an embodiment, the auxiliary processor 1123 (e.g., an image signal processor or a communication processor) may be implemented as part of another component (e.g., the camera module 1180 or the communication module 1190) functionally related to the auxiliary processor 1123. According to an embodiment, the auxiliary processor 1123 (e.g., the neural processing unit) may include a hardware structure specified for artificial intelligence model processing. An artificial intelligence model may be generated by machine learning. Such learning may be performed, e.g., by the electronic device 1101 where the artificial intelligence is performed or via a separate server (e.g., the server 1108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof, but is not limited thereto. The artificial intelligence model may, additionally or alternatively, include a software structure other than the hardware structure.

The memory 1130 may store various data used by at least one component (e.g., the processor 1120 or the sensor module 1176) of the electronic device 1101. The various data may include, for example, software (e.g., the program 1140) and input data or output data for a command related thereto. The memory 1130 may include the volatile memory 1132 or the non-volatile memory 1134.

The program 1140 may be stored in the memory 1130 as software, and may include, for example, an operating system (OS) 1142, middleware 1144, or an application 1146.

The input module 1150 may receive a command or data to be used by another component (e.g., the processor 1120) of the electronic device 1101, from the outside (e.g., a user) of the electronic device 1101. The input module 1150 may include, for example, a microphone, a mouse, a keyboard, a key (e.g., a button), or a digital pen (e.g., a stylus pen).

The sound output module 1155 may output sound signals to the outside of the electronic device 1101. The sound output module 1155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 1160 may visually provide information to the outside (e.g., a user) of the electronic device 1101. The display module 1160 may include, for example, a display, a hologram device, or a projector and control circuitry to control a corresponding one of the display, hologram device, and projector. According to an embodiment, the display module 1160 may include a touch sensor adapted to detect a touch, or a pressure sensor adapted to measure the intensity of force incurred by the touch.

The audio module 1170 may convert a sound into an electrical signal and vice versa. According to an embodiment, the audio module 1170 may obtain the sound via the input module 1150, or output the sound via the sound output module 1155 or a headphone of an external electronic device (e.g., an electronic device 1102) directly (e.g., wiredly) or wirelessly coupled with the electronic device 1101.

The sensor module 1176 may detect an operational state (e.g., power or temperature) of the electronic device 1101 or an environmental state (e.g., a state of a user) external to the electronic device 1101, and then generate an electrical signal or data value corresponding to the detected state. According to an embodiment, the sensor module 1176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 1177 may support one or more specified protocols to be used for the electronic device 1101 to be coupled with the external electronic device (e.g., the electronic device 1102) directly (e.g., wiredly) or wirelessly. According to an embodiment, the interface 1177 may include, for example, a high definition multimedia interface (HDMI), a universal serial bus (USB) interface, a secure digital (SD) card interface, or an audio interface.

A connecting terminal 1178 may include a connector via which the electronic device 1101 may be physically connected with the external electronic device (e.g., the electronic device 1102). According to an embodiment, the connecting terminal 1178 may include, for example, a HDMI connector, a USB connector, a SD card connector, or an audio connector (e.g., a headphone connector).

The haptic module 1179 may convert an electrical signal into a mechanical stimulus (e.g., a vibration or a movement) or electrical stimulus which may be recognized by a user via his tactile sensation or kinesthetic sensation. According to an embodiment, the haptic module 1179 may include, for example, a motor, a piezoelectric element, or an electric stimulator.

The camera module 1180 may capture a still image or moving images. According to an embodiment, the camera module 1180 may include one or more lenses, image sensors, image signal processors, or flashes.

The power management module 1188 may manage power supplied to the electronic device 1101. According to an embodiment, the power management module 1188 may be implemented as at least part of, for example, a power management integrated circuit (PMIC).

The battery 1189 may supply power to at least one component of the electronic device 1101. According to an embodiment, the battery 1189 may include, for example, a primary cell which is not rechargeable, a secondary cell which is rechargeable, or a fuel cell.

The communication module 1190 may support establishing a direct (e.g., wired) communication channel or a wireless communication channel between the electronic device 1101 and the external electronic device (e.g., the electronic device 1102, the electronic device 1104, or the server 1108) and performing communication via the established communication channel. The communication module 1190 may include one or more communication processors that are operable independently from the processor 1120 (e.g., the application processor (AP)) and supports a direct (e.g., wired) communication or a wireless communication. According to an embodiment, the communication module 1190 may include a wireless communication module 1192 (e.g., a cellular communication module, a short-range wireless communication module, or a global navigation satellite system (GNSS) communication module) or a wired communication module 1194 (e.g., a local area network (LAN) communication module or a power line communication (PLC) module). A corresponding one of these communication modules may communicate with the external electronic device via the first network 1198 (e.g., a short-range communication network, such as Bluetooth™, wireless-fidelity (Wi-Fi) direct, or infrared data association (IrDA)) or the second network 1199 (e.g., a long-range communication network, such as a legacy cellular network, a 5G network, a next-generation communication network, the Internet, or a computer network (e.g., LAN or wide area network (WAN)).

These various types of communication modules may be implemented as a single component (e.g., a single chip), or may be implemented as multi components (e.g., multi chips) separate from each other. The wireless communication module 1192 may identify and authenticate the electronic device 1101 in a communication network, such as the first network 1198 or the second network 1199, using subscriber information (e.g., international mobile subscriber identity (IMSI)) stored in the subscriber identification module 1196.

The wireless communication module 1192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 1192 may support a high-frequency band (e.g., the mmWave band) to achieve, e.g., a high data transmission rate. The wireless communication module 1192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 1192 may support various requirements specified in the electronic device 1101, an external electronic device (e.g., the electronic device 1104), or a network system (e.g., the second network 1199). According to an embodiment, the wireless communication module 1192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 1197 may transmit or receive a signal or power to or from the outside (e.g., the external electronic device) of the electronic device 1101. According to an embodiment, the antenna module 1197 may include an antenna including a radiating element composed of or including a conductive material or a conductive pattern formed in or on a substrate (e.g., a printed circuit board (PCB)). According to an embodiment, the antenna module 1197 may include a plurality of antennas (e.g., array antennas). In such a case, at least one antenna appropriate for a communication scheme used in the communication network, such as the first network 1198 or the second network 1199, may be selected, for example, by the communication module 1190 (e.g., the wireless communication module 1192) from the plurality of antennas. The signal or the power may then be transmitted or received between the communication module 1190 and the external electronic device via the selected at least one antenna. According to an embodiment, another component (e.g., a radio frequency integrated circuit (RFIC)) other than the radiating element may be additionally formed as part of the antenna module 1197.

According to various embodiments, the antenna module 1197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 1101 and the external electronic device 1104 via the server 1108 coupled with the second network 1199. Each of the electronic devices 1102 or 1104 may be a device of a same type as, or a different type, from the electronic device 1101. According to an embodiment, all or some of operations to be executed at the electronic device 1101 may be executed at one or more of the external electronic devices 1102, 1104, or 1108. For example, if the electronic device 1101 should perform a function or a service automatically, or in response to a request from a user or another device, the electronic device 1101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 1101. The electronic device 1101 may provide the outcome, with or without further processing of the outcome, as at least part of a reply to the request. To that end, a cloud computing, distributed computing, mobile edge computing (MEC), or client-server computing technology may be used, for example. The electronic device 1101 may provide ultra low-latency services using, e.g., distributed computing or mobile edge computing. In an embodiment, the external electronic device 1104 may include an internet-of-things (IoT) device. The server 1108 may be an intelligent server using machine learning and/or a neural network. According to an embodiment, the external electronic device 1104 or the server 1108 may be included in the second network 1199. The electronic device 1101 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, a home appliance, or the like. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used in connection with various embodiments of the disclosure, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 1140) including one or more instructions that are stored in a storage medium (e.g., internal memory 1136 or external memory 1138) that is readable by a machine (e.g., the electronic device 1101). For example, a processor (e.g., the processor 1120) of the machine (e.g., the electronic device 1101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium in which, for example, the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Advantageous effects obtainable from the disclosure may not be limited to the above mentioned effects, and other effects which are not mentioned may be clearly understood, through the following descriptions, by those skilled in the art to which the disclosure pertains.

The methods according to various embodiments described in the claims or the specification of the disclosure may be implemented by hardware, software, or a combination of hardware and software.

When the methods are implemented by software, a computer-readable storage medium for storing one or more programs (software modules) may be provided. The one or more programs stored in the computer-readable storage medium may be configured for execution by one or more processors within the electronic device. The at least one program may include instructions that cause the electronic device to perform the methods according to various embodiments of the disclosure as defined by the appended claims and/or disclosed herein.

The programs (software modules or software) may be stored in non-volatile memories including a random access memory and a flash memory, a read only memory (ROM), an electrically erasable programmable read only memory (EEPROM), a magnetic disc storage device, a compact disc-ROM (CD-ROM), digital versatile discs (DVDs), or other type optical storage devices, or a magnetic cassette. Alternatively, any combination of some or all of them may form a memory in which the program is stored. Further, a plurality of such memories may be included in the electronic device.

In addition, the programs may be stored in an attachable storage device which may access the electronic device through communication networks such as the Internet, Intranet, Local Area Network (LAN), Wide LAN (WLAN), and Storage Area Network (SAN) or a combination thereof. Such a storage device may access the electronic device via an external port. Further, a separate storage device on the communication network may access a portable electronic device.

In the above-described detailed embodiments of the disclosure, an element included in the disclosure is expressed in the singular or the plural according to presented detailed embodiments. However, the singular form or plural form is selected appropriately to the presented situation for the convenience of description, and the disclosure is not limited by elements expressed in the singular or the plural. Therefore, either an element expressed in the plural may also include a single element or an element expressed in the singular may also include multiple elements.

While the disclosure has been illustrated and described with reference to various example embodiments, it will be understood that the various example embodiments are intended to be illustrative, not limiting. It will be further understood by those of ordinary skill in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

What is claimed is:

1. An electronic device comprising:

a first printed circuit board comprising a designated area comprising a first area, wherein the first printed circuit board comprises at least one first pad and at least one second pad arranged along a periphery of the first area; and a first radio frequency (RF) front end module disposed on the designated area of the first printed circuit board, wherein the first radio frequency (RF) front end module comprises a first electronic element, wherein the first electronic element is disposed on the first area and the at least one first pad, wherein the first electronic element overlaps with the at least one first pad and does not overlap with the at least one second pad, when viewed from above the printed circuit board, and wherein the first electronic element is grounded to the at least one second pad among the at least one first pad and the at least one second pad.

2. The electronic device of claim 1, wherein the first electronic element is in contact with the at least one first pad and is not in contact with the at least one second pad.

3. The electronic device of claim 1, wherein the first radio frequency (RF) front end module comprises at least one first connection member corresponding to the at least one second pad, and wherein the first electronic element is grounded to the at least one second pad through the at least one first connection member.

4. The electronic device of claim 3, wherein the at least one first connection member comprises a solder ball.

5. The electronic device of claim 1, wherein the designated area comprises a second area, wherein the first printed circuit board comprises at least one third pad and at least one fourth pad arranged along a periphery of the second area, wherein the first radio frequency (RF) front end module comprises a second electronic element, wherein the second electronic element is disposed on the second area, wherein the second electronic element does not overlap with the at least one third pad and the at least one fourth pad, when viewed from above the printed circuit board, and wherein the second electronic element is grounded to at least one of the at least one third pad or the at least one fourth pad.

6. The electronic device of claim 5, wherein the second electronic element is not contact with the at least one third pad and at least one fourth pad.

7. The electronic device of claim 5, wherein the first radio frequency (RF) front end module comprises at least one second connection member corresponding to at least one of the at least one third pad or the at least one fourth pad, and wherein the second electronic element is grounded to at least one of the at least one third pad or the at least one fourth pad through the at least one second connection member.

8. The electronic device of claim 7, wherein the at least one second connection member comprises a solder ball.

* * * * *